(12) United States Patent
Patel et al.

(10) Patent No.: US 7,041,224 B2
(45) Date of Patent: May 9, 2006

(54) METHOD FOR VAPOR PHASE ETCHING OF SILICON

(75) Inventors: Satyadev R. Patel, Elk Grove, CA (US); Gregory P. Schaadt, Santa Clara, CA (US); Douglas B. MacDonald, Los Gatos, CA (US); Hongqin Shi, Santa Clara, CA (US); Andrew G. Huibers, Mountain View, CA (US); Peter Heureux, Felton, CA (US)

(73) Assignee: Reflectivity, Inc., Sunnyvale, CA (US)

( * ) Notice: Subject to any disclaimer, the term of this patent is extended or adjusted under 35 U.S.C. 154(b) by 358 days.

(21) Appl. No.: 10/104,109

(22) Filed: Mar. 22, 2002

(65) Prior Publication Data

US 2002/0195423 A1    Dec. 26, 2002

Related U.S. Application Data

(63) Continuation-in-part of application No. 09/954,864, filed on Sep. 17, 2001, now Pat. No. 6,942,811, and application No. 09/649,569, Aug. 28, 2000, now Pat. No. 6,949,202, which is a continuation-in-part of application No. 09/427,841, filed on Oct. 26, 1999, now Pat. No. 6,290,864.

(51) Int. Cl.
*B81C 1/00* (2006.01)
(52) U.S. Cl. .................. 216/2; 216/24; 216/72; 216/73; 216/74; 216/79
(58) Field of Classification Search .............. 216/2, 216/51, 60, 72–74, 79, 24; 252/79.1
See application file for complete search history.

(56) References Cited

U.S. PATENT DOCUMENTS 3,511,727 A    5/1970  Hays (Continued)

FOREIGN PATENT DOCUMENTS

EP    0704884 A2    4/1996

(Continued)

OTHER PUBLICATIONS

Aliev et al., "Development of Si(100) Surface Roughness at the Initial Stage of Etching in F2 and XeF2 Gases Ellipsometric Study", Surface Science 442 (1999), pp. 206-214.

(Continued)

*Primary Examiner*—Allan Olsen
(74) *Attorney, Agent, or Firm*—Gregory R. Muir

(57) ABSTRACT

The etching of a material in a vapor phase etchant is disclosed where a vapor phase etchant is provided to an etching chamber at a total gas pressure of 10 Torr or more, preferably 20 Torr or even 200 Torr or more. The vapor phase etchant can be gaseous acid etchant, a noble gas halide or an interhalogen. The sample/workpiece that is etched can be, for example, a semiconductor device or MEMS device, etc. The material that is etched/removed by the vapor phase etchant is preferably silicon and the vapor phase etchant is preferably provided along with one or more diluents. Another feature of the etching system includes the ability to accurately determine the end point of the etch step, such as by creating an impedance at the exit of the etching chamber (or downstream thereof) so that when the vapor phase etchant passes from the etching chamber, a gaseous product of the etching reaction is monitored, and the end point of the removal process can be determined. The vapor phase etching process can be flow through, a combination of flow through and pulse, or recirculated back to the etching chamber. A first plasma or wet chemical etch (or both) can be performed prior to the vapor phase etch.

160 Claims, 9 Drawing Sheets

FOREIGN PATENT DOCUMENTS

| | | |
|---|---|---|
| EP | 0822582 A2 | 2/1998 |
| EP | 0822584 A2 | 4/1998 |
| EP | 0838839 A2 | 4/1998 |
| EP | 0878824 A2 | 11/1998 |
| EP | 0955668 A2 | 11/1999 |
| EP | 0878824 A3 | 1/2000 |
| JP | 1982/57098679 A | 6/1982 |
| JP | 1983/58130529 A | 8/1983 |
| JP | 1985/60057938 A | 4/1985 |
| JP | 1986/601053732 A | 3/1986 |
| JP | 1986/61134019 A | 6/1986 |
| JP | 1986/61181131 A | 8/1986 |
| JP | 1986/61187238 A | 8/1986 |
| JP | 1986/61270830 A | 12/1986 |
| JP | 1987/62071217 A | 4/1987 |
| JP | 1988/63155713 A | 6/1988 |
| JP | 1989/01208834 A | 8/1989 |
| JP | 1989/10217921 A | 8/1989 |
| JP | 1990/02250323 A | 10/1990 |
| JP | 1991/03012921 A | 1/1991 |
| JP | 1992/04096222 A | 3/1992 |
| JP | 1995/07029823 A | 1/1995 |
| JP | 1997/09251981 A | 9/1997 |
| JP | 1998/10313128 A | 11/1998 |
| JP | 10313128 A * | 11/1998 |
| JP | 1998/10317169 A | 12/1998 |
| WO | WO-98/05605 | 2/1998 |
| WO | WO-98/13856 | 4/1998 |
| WO | WO-98/32163 | 7/1998 |
| WO | WO-99/01887 | 1/1999 |
| WO | WO-99/03313 | 1/1999 |
| WO | WO-99/49506 | 9/1999 |
| WO | WO-00/52740 | 8/2000 |

OTHER PUBLICATIONS

Glidemeister, J.M., "Xenon Difluoride Etching System" (Nov. 17, 1997).

Habuka et al., "Dominant Overall Chemical Reaction in a Chlorine Trifluoride-Silicon-Nitrogen System at Atmospheric Pressure", Japan Journal of Applied Physics vol. 38 (1999), pp. 6466-6469.

Hecht et al., "A Novel X-ray Photoelectron Spectroscopy Study of the Al/SiO2 Interface", J. Appl. Phys. vol. 57 (Jun. 15, 1985), pp. 5256-5261.

Houle, F.A., "Dynamics of SiF4 Desorption During Etching of Silicon by XeF2". IBM Almaden Research Center (Apr. 15, 1987), pp. 1866-1872.

Flamm et al., "XeF2 and F-Atom Reactions with Si: Their Significance for Plasma Etching", Solid State Technol. 26, 117 (1983).

Ibbotson et al., "Plasmaless Dry Etching of Silicon with Fluorine-containing Compounds", J. Appl. Phys. vol. 56 No. 10 (Nov. 1984), pp. 2939-2942.

Ibbotson et al., "Comparison of XeF2 and F-atom Reactions with Si and SiO2", Applied Physics Letter. vol. 44, 1129 (1984).

Streller et al., "Selectivity in Dry Etching of Si (100) and XeF2 and VUV Light", Elsevier Science B.V., Applied Surface Science vol. 106 (1996), pp. 341-346.

Vugts et al., "Si/XeF2 Etching: Temperature Dependence", J. Vac. Sci. Technol. A 14(5) (Sep./Oct. 1996), pp. 2766-2774.

Wang et al., "Gas-Phase Silicon Etching with Bromine Trifluoride", Transducers '97, 1997 International Conference on Solid-State Sensors and Actuators, Chicago (Jun. 16-19, 1997), pp. 1505-1508.

Winters, H.F., "Etch Products from the Reaction of XeF2 with SiO2, SiO3, Si3N4, SiC, and Si in the Presence of Ion Bombardment", J. Vac. Sci. Technol. B 1(4) (Oct./Dec. 1983). pp. 927-931.

Winters et al., "The Etching of Silicon with XeF2 Vapor", Appl. Phys. Letter, vol. 34(1) (Jan. 1, 1979), pp. 70-73.

XACTIX, Inc., Marketing Brochure (Jun. 27, 1999).

"Xenon Difluoride Isotropic Etch System: Seeing is Believing", Surface Technology Systems Ltd. brochure, Newport, UK (date unknown).

Assorted promotional literature, Surface Technology Systems Ltd., Newport, UK (Jul. 28, 1999).

* cited by examiner

U.S. PATENT DOCUMENTS

| | | |
|---|---|---|
| 4,190,488 A | 2/1980 | Winters |
| 4,310,380 A | 1/1982 | Flamm et al. |
| 4,498,953 A | 2/1985 | Cook et al. |
| 4,695,700 A | 9/1987 | Provence et al. |
| 4,740,410 A | 4/1988 | Muller et al. |
| 4,749,440 A | 6/1988 | Blackwood et al. |
| 4,789,426 A | 12/1988 | Pipkin |
| 5,206,471 A | 4/1993 | Smith |
| 5,330,301 A | 7/1994 | Brancher |
| 5,439,553 A | 8/1995 | Grant et al. |
| 5,534,107 A | 7/1996 | Gray et al. |
| 5,604,367 A * | 2/1997 | Yang ................. 257/321 |
| 5,672,242 A | 9/1997 | Jen |
| 5,716,495 A | 2/1998 | Butterbaugh et al. |
| 5,726,480 A | 3/1998 | Pister |
| 5,753,073 A | 5/1998 | Jen |
| 5,757,456 A | 5/1998 | Yamazaki et al. |
| 5,835,256 A | 11/1998 | Huibers |
| 5,858,065 A | 1/1999 | Li et al. |
| 6,022,456 A | 2/2000 | Tai et al. |
| 6,051,503 A | 4/2000 | Bhardwaj et al. |
| 6,153,115 A * | 11/2000 | Le et al. ................. 216/60 |
| 6,162,367 A * | 12/2000 | Tai et al. ................ 216/79 |
| 6,277,173 B1 | 8/2001 | Sadakata et al. |
| 6,290,864 B1 | 9/2001 | Patel et al. |
| 6,328,801 B1 | 12/2001 | Gary et al. |
| 6,334,928 B1 | 1/2002 | Sekine et al. |
| 6,355,181 B1 | 3/2002 | McQuarrie |
| 2001/0002663 A1 | 6/2001 | Tai et al. |
| 2002/0033229 A1 | 3/2002 | Lebouitz |

METHOD FOR VAPOR PHASE ETCHING OF SILICON

This application is a continuation-in-part of U.S. patent application Ser. No. 09/954,864 to Patel et al. filed Sep. 17, 2001 now U.S. Pat. No. 6,942,811, which is a continuation in part of Ser. No. 09/427,841 to Patel et al. filed Oct. 26, 1999 (now U.S. Pat. No. 6,290,864) and U.S. patent application Ser. No. 09/649,569 to Patel et al., filed Aug. 28, 2000 now U.S. Pat. No. 6,949,202, the contents of each being incorporated herein by reference.

BACKGROUND OF THE INVENTION

This invention is in the area of the manufacture of MEMS (microelectromechanical systems) as well as semiconductor devices, or any other devices that require removal of a material relative to a substrate or other deposited material. In particular, this invention addresses gas-phase etching procedures, with particular emphasis on etching pressure with a preferably spontaneous chemical etchant as well as detection of the end point in an etching process, use of diluents, recirculation of etchant gas, and/or other additional features set forth below. The invention is also directed to apparatus for implementing one or more of these method features. "MEMS", "microelectromechanical" and "micromechanical" are used interchangeably throughout this application and each may or may not have an electrical component in addition to the microstructure component.

The use of etchants for removing sacrificial layers or regions in a multilayer structure without removal of an adjacent layer or region is a necessary and common step in the manufacture of semiconductor and MEMS devices. The MEMS devices of the present invention can be devices for inertial measurement, pressure sensing, thermal measurement, micro-fluidics, optics, and radio-frequency communications, with specific examples including optical switches, micromirror arrays for projection displays, accelerometers, variable capacitors and DC or RF switches. If a semiconductor device is etched, it can be any device that is made of or has on a substrate a material that is to be removed with a preferably gas phase chemical etchant.

The success of an etch step in the manufacture of microstructures is improved not only due to the selectivity of the etchant, but also due to the ability to accurately determine the end point of the etching process. Isotropic etching is of particular interest in processes where the purpose of the etch is to remove a sacrificial layer that is intervening between functional layers or between a functional layer and a substrate. Gas phase etchants, particularly in the absence of plasma, are desirable for isotropically removing a sacrificial layer.

The method of the present invention is useful for producing semiconductor devices and deflectable MEMS elements (deflectable by electrostatic or other means) which, if coated (before or after gas phase processing) with a reflective layer, can act as an actuatable micromirror. Arrays of such micromirrors can be provided for direct view or projection display systems (e.g. projection television or computer monitors), as well as for optical switching. The present invention is also adaptable to etching microfabricated devices other than deflectable MEMS devices (e.g. semiconductor based devices, carbon nanotubes on glass, nondeflectable MEMS devices such as sensors, etc.).

SUMMARY OF THE INVENTION

The present invention provides improvements in the apparatus and methods used for the etching of layers or areas, and in particular, for achieving high selectivity and/or determining an end of the etching reaction. In one embodiment of the invention, a silicon material is etched at a total gas pressure at the etch sight of 10 Torr or more, preferably 20 Torr or more, or even 50, 100 or 200 Torr or more. Other features of the invention, including use of diluents along with the vapor phase etchant, etching slower than 25 or 20 um/hr, recirculating or agitating etching gas during the etch, detecting gas components in order to determine an etch end point, improved selectivity, plasma etching prior to the vapor phase etch, among others, are set forth in further detail herein.

DETAILED DESCRIPTION OF THE PREFERRED EMBODIMENTS

While this invention is susceptible to a variety of constructions, arrangements, flow schemes, and embodiments in general, the novel features that characterize the invention are best understood by first reviewing a typical process flow arrangement in which the various aspects of this invention might be used.

Figure 1:
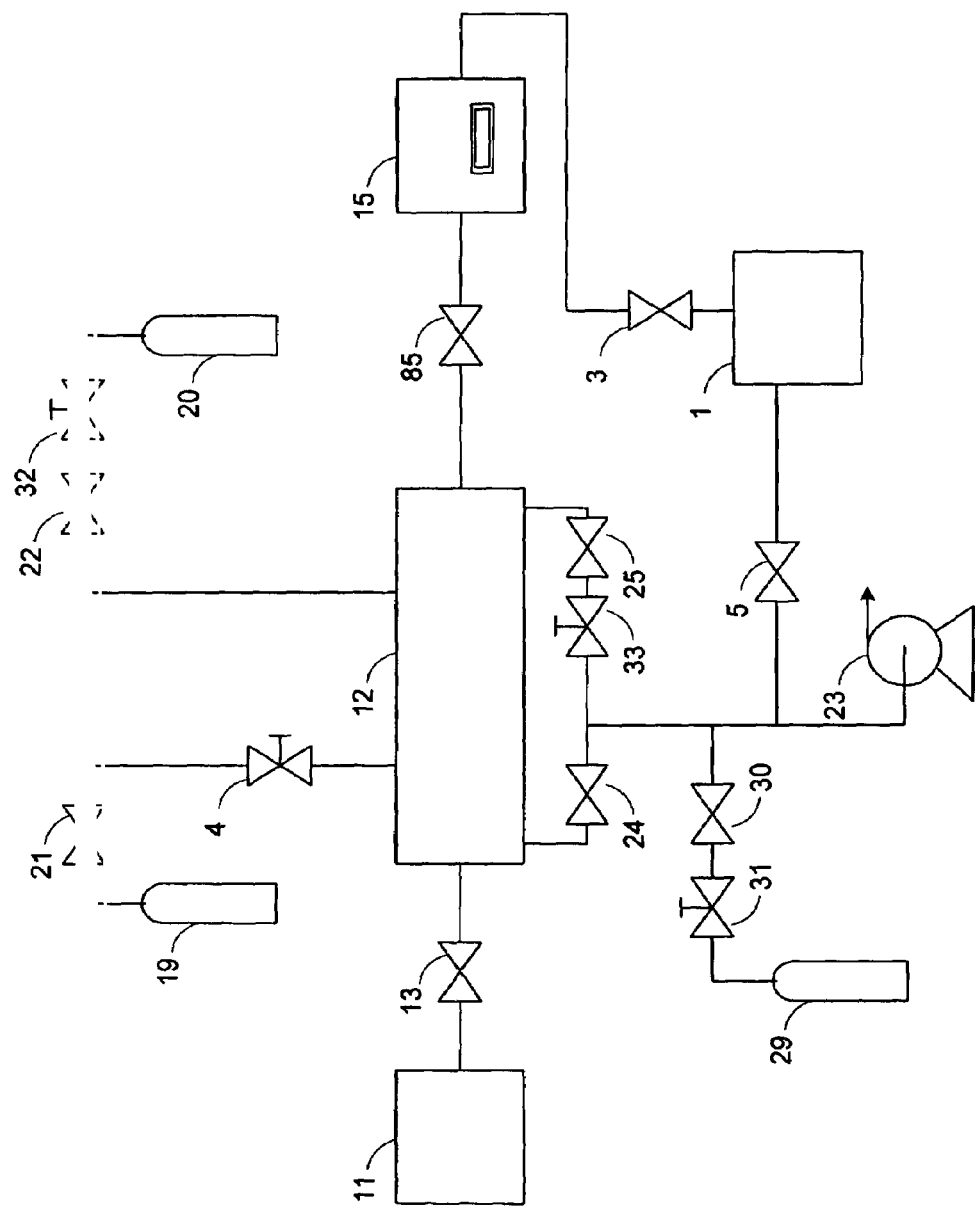
FIG. 1 is a diagram showing an example of a system for etching and stopping the etch in accordance with the present invention.

As can be seen in FIG. 1, an apparatus is provided for etching a sample that includes a source chamber 11 containing a source of chemical etchant, maintained at a particular temperature and pressure for maintaining the etchant source in a solid or liquid state (e.g. solid state for XeF2 crystals, liquid state for BrF3, etc.). An expansion chamber 12 is in fluid communication with source chamber 11 and has any suitable size (e.g. a volumetric capacity of 29 cubic inches (0.46 liter)) to receive etchant gas from the source chamber 11, with a shutoff valve 13 joining these two chambers. An etch chamber 15 is provided in fluid communication with expansion chamber 12 and has any suitable size (e.g. volumetric capacity of 12 cubic inches (0.18 liter))

to contain the sample microstructure to be etched. It is preferred that the etch chamber be smaller than the expansion chamber. The etch chamber 15 is connected to the expansion chamber 12 via a shutoff valve 85. Also included in the apparatus is a first gas source 19 in fluid communication with the expansion chamber 12 via a further shutoff valve 21, a second gas source 20 in fluid communication with the expansion chamber through a separate shutoff valve 22, a vacuum pump 23 and associated shutoff valves 24, 25 to control the evacuation of the chambers.

Also shown in FIG. 1 are a third gas source 29 serving as a pump ballast with an associated shutoff valve 30 to prevent backstreaming from the pump 23, and needle valves 32, 33, 31 to set the gas flow rates through the various lines and to permit fine adjustments to the pressures in the chambers. Also shown, as will be discussed in more depth below, are gas analyzer 1 and valves 3 and 5 on opposite sides of the analyzer. The expansion chamber 12 and the etch chamber 15 can both be maintained at a particular temperature, while different gases are placed in the first and second gas sources for the various etching processes. It should be noted that a single gas source could be used in place of gas sources 19 and 20.

The general procedure followed in these experiments began with the evacuation of both the expansion chamber 12 and the etch chamber 15, followed by venting both chambers to atmospheric pressure with gas from the first gas source 19 by opening the two shutoff valves 21, 85, between this gas source and the two chambers. The sample was then placed in the etch chamber 15 (with the shutoff valves 21, 85 open during the sample insertion) which was then sealed, and both the expansion chamber 12 and the etch chamber 15 were evacuated. All valves were then closed.

The connecting valve 85 between the expansion chamber 12 and the etch chamber 15 was opened, and the shutoff valve 21 at the outlet of the first gas source 19 was opened briefly to allow the gas from the first gas source to enter the expansion and etch chambers. The shutoff valve 21 is then closed. The connecting valve 85 is then closed, and the expansion chamber 12 is evacuated and isolated. The supply valve 13 from the etchant source chamber 11 is then opened to allow etchant gas to enter the expansion chamber (due to the higher temperature of the expansion chamber). The supply valve 13 is then closed, outlet valve 25 is opened, and the needle valve 33 is opened slightly to lower the etchant pressure in the expansion. Both the outlet valve 25 and the needle valve 33 are then closed. The shutoff valve 22 at the second gas source 20 is then opened and with the assistance of the needle valve 32, gas from the second gas source is bled into the expansion. At this point the expansion chamber 12 contains the etchant gas plus gas from the second gas source 20, while the etch chamber 15 contains gas from the first gas source.

With pump 23 on, the connecting valve 85 between the expansion chamber 12 and the etch chamber 15 is then opened, and valves 3 and 5 are opened on both sides of gas analyzer 1, to allow the gas mixture from the expansion chamber to enter the etch chamber and flow through the etch chamber and gas analyzer, thereby beginning the etch process. As will be discussed further below, the etch process is continued until an end point is detected via the gas analyzer.

Many alternatives to the process scheme described above can be used. Additional gas sources and chambers, for example, can be utilized. For example, depending upon the diluent(s) used (gas sources 19 and 20), a plurality of diluent sources (N2, Ar, He, etc.) can be connected to the expansion chamber and/or to the recirculation loop for bleeding the system after an etch. The air distribution system within the etching chamber can also be varied, for example by including U-shaped or cone-shaped baffles, or by using additional perforated plates and/or baffles.

Figure 2:
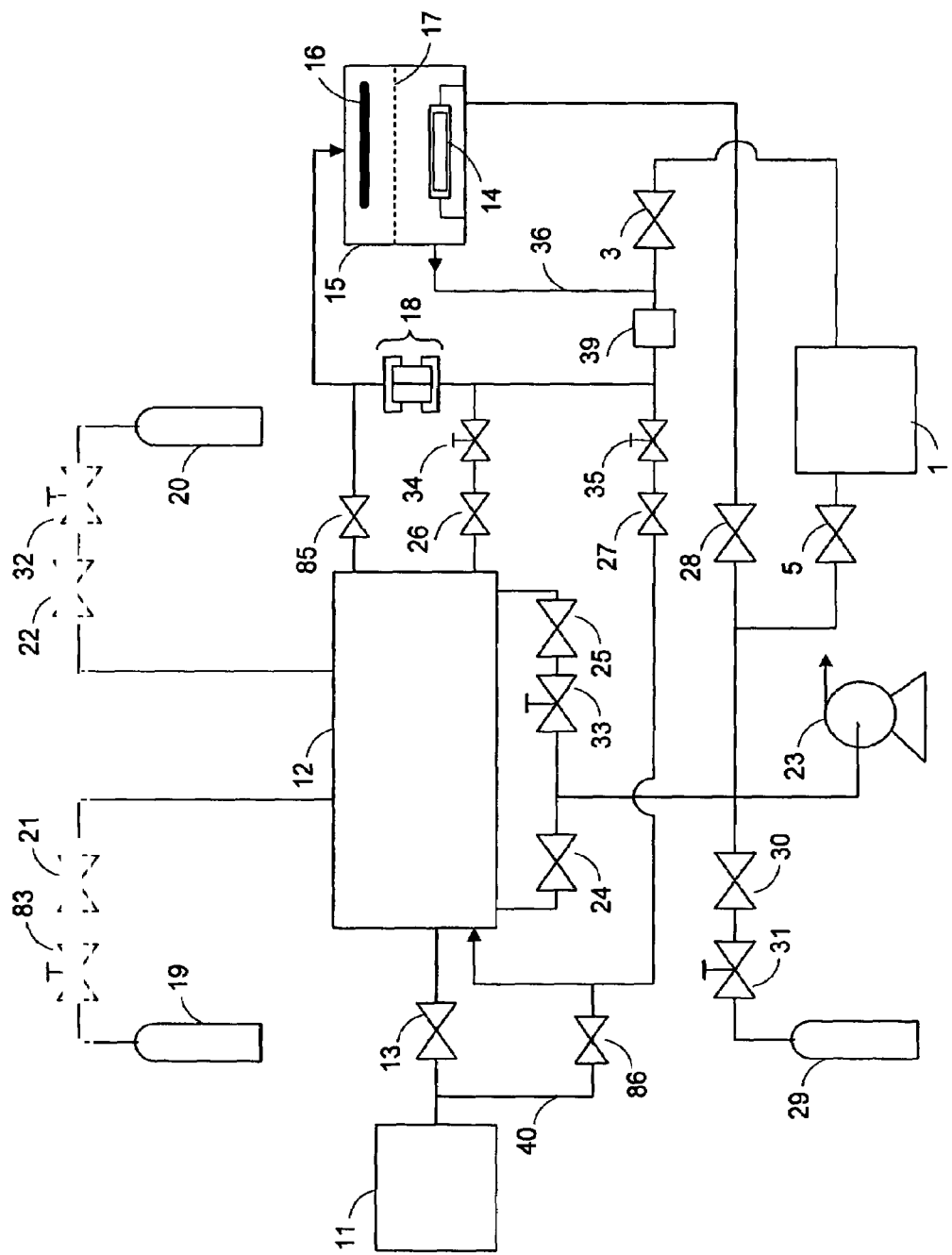
FIG. 2 is a diagram of a second example of a system for etching and stopping the etch in accordance with the present invention.

A specific alternative to the embodiment of FIG. 1 is illustrated in FIG. 2. FIG. 2 represents such a process flow arrangement in which the process is an etching process having a detectable end point. The etchant gas originates in a source chamber 11. An example of an etchant gas that is conveniently evaporated from a liquid is bromine trifluoride, whereas an example of an etchant gas that is conveniently sublimated from solid crystals is xenon difluoride. Effective results can be achieved by maintaining the crystals under 40 degrees C. (e.g. at a temperature of 28.5° C.). (Xenon difluoride is only one of several etchant gases that can be used. Examples of other gases are presented below.) The sublimation pressure of xenon difluoride crystals at 28.5° C. is 5–11 mbar (4–8 torr). An expansion chamber 12 receives xenon difluoride gas from the crystals in the source chamber (s) 11, and a shutoff valve 13 is positioned between the source and expansion chambers. The sample 14 to be etched is placed in an etch chamber 15 (which contains a baffle 16 a perforated plate 17), and a reciprocating pump 18 that is positioned between the expansion chamber 12 and the etch chamber 15. (The reciprocating pump and its valves are shown in more detail in a FIGS. 3a and 3b and described below.) Also illustrated in FIG. 2, and will be discussed further below, is a gas analyzer 1 with valves 3 and 5 that control the flow of gas from the etching chamber through the gas analyzer.

Also shown are two individual gas sources 19, 20 supplying the expansion chamber 12 through shutoff valves 21, 22, a vacuum pump 23 and associated shutoff valves 24, 25, 26, 27, 28 to control the evacuation of the chambers, a third gas source 29 serving as a pump ballast with an associated shutoff valve 30 to prevent backstreaming from the pump 23, and manually operated needle valves 31, 32, 33, 34, 35, 83 to set the gas flow rates through the various lines and to permit fine adjustments to the pressures in the chambers. When xenon difluoride is used, the expansion chamber 12 and the etch chamber 15 are typically maintained at around room temperature (e.g. 25.0° C.). However, the expansion chamber and etch chamber could also be heated (e.g. to between 25 and 40 degrees C.), though this would likely be performed in conjunction with directly cooling the sample being processed, as will be discussed below. A recirculation line 36 permits gas to flow continuously through the etch chamber 15 in a circulation loop that communicates (via valves 26, 27, and 34, 35) with the expansion chamber 12 and reenters the etch chamber 15 by way of the reciprocating pump 18. Valve 85 permits gas transfer between expansion chamber 12 and etch chamber 15 via a portion of the recirculation line 36 without traversing recirculation pump 18. Valve 86 in path 40 permits introduction of etchant gas into the expansion chamber 12 to replenish the etchant mixture during the etching process. The valves are preferably corrosive gas resistant bellows-sealed valves, preferably of aluminum or stainless steel with corrosive resistant O-rings for all seals (e.g. Kalrez™ or Chemraz™). The needle valves are also preferably corrosion resistant, and preferably all stainless steel. As an optional feature, a filter 39 can be placed in the recirculation line 36 to remove etch byproducts from the recirculation flow, thereby reducing the degree of dilution of the etchant gas in the flow. The filter can also serve to reduce the volume of effluents from the process.

The etch chamber 15 can be of any shape or dimensions, but the most favorable results will be achieved when the internal dimensions and shape of the chamber are those that will promote even and steady flow with no vortices or dead volumes in the chamber interior. A preferred configuration for the etch chamber is a circular or shallow cylindrical chamber, with a process gas inlet port at the center of the top of the chamber, plus a support in the center of the chamber near the bottom for the sample, and an exit port in the bottom wall or in a side wall below the sample support. The baffle 16 is placed directly below the entry port. The distance from the port to the upper surface of the baffle is not critical to this invention and may vary, although in preferred embodiments of the invention the distance is within the range of from about 0.1 cm to about 6.0 cm, and most preferably from about 0.5 cm to about 3.0 cm. Although its shape is not shown in FIG. 2, the baffle is preferably circular or otherwise shaped to deflect the gas stream radially over a 360° range. The perforated plate 17 is wider than the baffle 16 and preferably transmits all gas flow towards the sample. A preferred configuration for the perforated plate is one that matches the geometry of the sample; thus, for a circular sample the perforated plate is preferably circular as well.

Figure 3A:
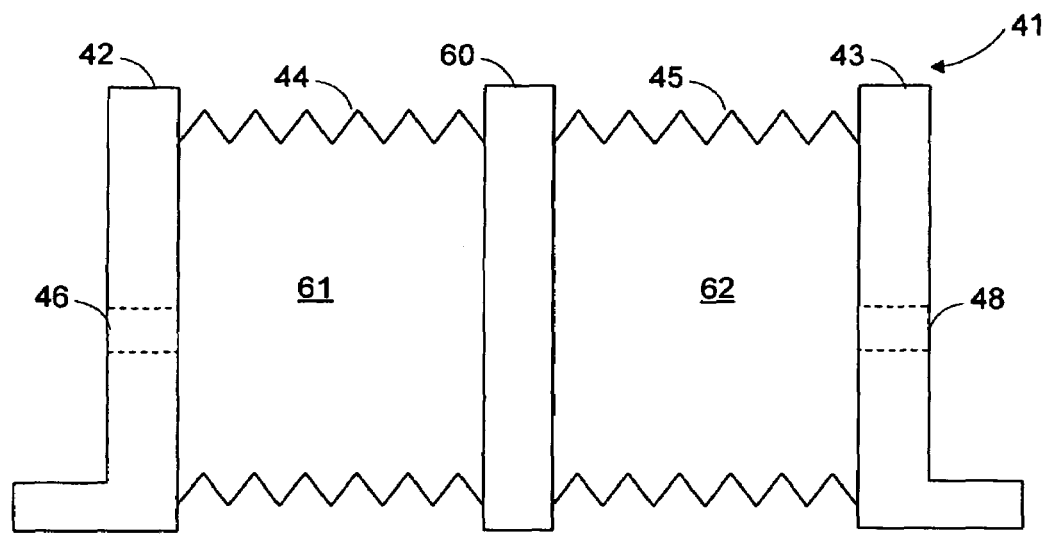
FIG. 3A is a side elevation view of one example of a reciprocating pump for use in one embodiment of the invention.
Figure 3B:
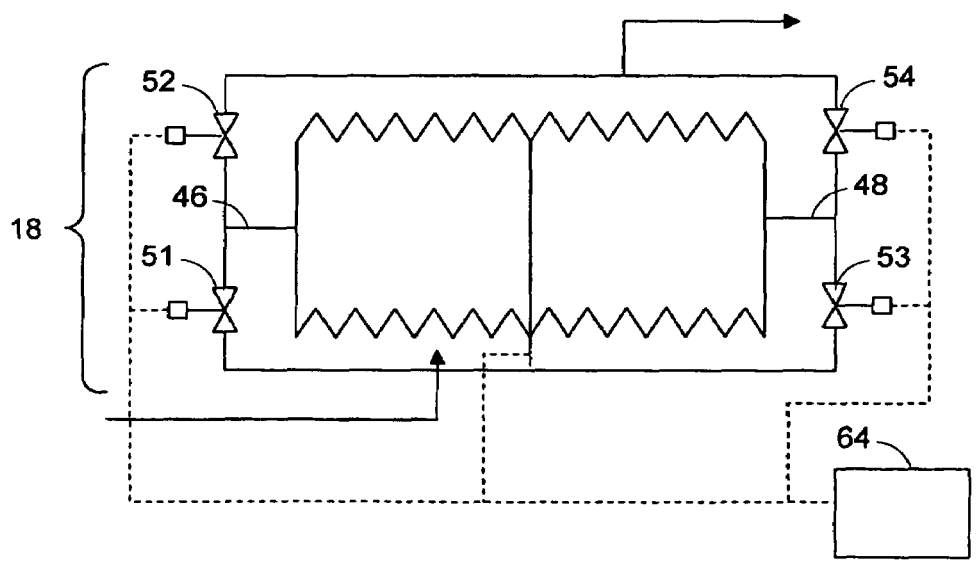
FIG. 3B is a pump flow diagram of the reciprocating pump of FIG. 3A together with associated flow lines and shutoff valves.

FIGS. 3a and 3b are diagrams of an example of a reciprocating pump 18 that can be used in the practice of this invention. The design shown in these diagrams can be varied in numerous ways, such as by increasing the number of chambers to three or more, or by arranging a series of such pumps in parallel. The following discussion is directed to the particular design shown in these diagrams.

The side elevation view of FIG. 3a shows the pump housing 41, which consists of two stationary end walls 42, 43 joined by bellows-type side walls 44, 45. The bellows-type side walls 44, 45 are so-called because they are either pleated like an accordion or otherwise constructed to permit bellows-type expansion and contraction. The end walls 42, 43 and the bellows-type sidewalls 44, 45 together fully enclose the interior of the pump except for inlet/outlet ports on each side wall. The arrangement of these ports is shown in the pump flow diagram of FIG. 3b, the left side-wall 42 having one inlet/outlet port 46, and the right side wall 43 likewise having one inlet/outlet port 48. Remotely controlled shutoff valves 51, 52, 53, 54 are placed on the external lines leading to or from each inlet/outlet port. For fail-safe operation, shutoff valves 51, 54 are normally open and shutoff valves 52, 53 are normally closed.

The movable partition 60 shown in FIG. 3a divides the pump interior into two chambers 61, 62, the partition and its connections to the remaining portions of the housing being fluid-impermeable so that the two chambers are completely separate with no fluid communication between them. The partition 60 joins the bellows-type side walls 44, 45 and moves in the two directions indicated by the two-headed arrow 63. The movement is driven by a suitable drive mechanism (not shown) capable of reciprocating movement. Many such drive mechanisms are known to those skilled in the art and can be used. In the view shown in FIG. 3a, movement of the partition to the left causes the left chamber 61 to contract and the right chamber 62 to expand. With the pump shutoff valves appropriately positioned, i.e., valves 52 and 53 open and valves 51 and 54 closed, the contracting left chamber 61 will discharge its contents through its inlet/outlet port 46 while the expanding right chamber 62 will draw gas in through its inlet/outlet port 48. Once the partition 60 has reached the end of its leftward travel, it changes direction and travels to the right and the shutoff valves are switched appropriately, causing the expanded right chamber 62 to contract and discharge its contents through its inlet/outlet port 48 while the contracted left chamber 61 expands and draws fresh gas in through its inlet/outlet port 46. In this manner, the pump as a whole produces a gas flow in a substantially continuous manner, the discharge coming alternately from the two chambers. A controller 64 governs the direction and range of motion, and the speed and cycle time of the partition 60, and coordinates the partition movement with the opening and closing of the shutoff valves 51, 52, 53, 54. Conventional controller circuitry and components can be used.

The pump for recirculating the process gas as shown, and others within the scope of this invention, has no sliding or abrading parts or lubricant that come into contact with the process gas. Alternative pumps that meet this criteria are possible, including pumps with expandable balloon chambers, pumps with concentric pistons connected by an elastic sealing gasket, or peristaltic pumps. The pump materials, including the bellows-type walls, can thus be made of materials that are resistant or impervious to corrosion from the etchant gas. One example of such a material, useful for operating temperatures below 50° C., is stainless steel. Others are aluminum, Inconel, and Monel. Still others will be readily apparent to those experienced in handling these gases. While the capacity and dimensions of the pump and its chambers may vary, a presently preferred embodiment is one in which the change in volume of each chamber upon the movement of the partition across its full range is approximately from 0.05 to 4.2 L, though preferably from 0.1 to 1.5 L, with one example being 0.5 L. Larger chamber sizes (e.g. 5 to 20 L) are possible, which, if combined with a slower pumping speed, can benefit from lower wear on the pump. At a partition speed of one cycle every two seconds, the pump rate (for 0.5 L) will be 30 L/min. Different combinations of pump sizes and pump speeds are possible, though the preferred pump volume per time is between 7 and 150 L/min, with a preferred range of from 30 to 90 L/min.

The pump described above can be lined with a suitable lining to further reduce particulate contamination of the process gas mixture during etching. Pumps that are not of the bellows type can also be used. The preferred pumps are those that are resistant to corrosion by the process gas mixture and those that are designed to avoid introducing particulate or liquid material into the process gas mixture. Dry pumps, i.e., those that do not add exogenous purge or ballast gas into the process gas mixture, are preferred. Alternatively, the process gas could be circulated by temperature cycling (with large variations in the heating and cooling of the recirculation path).

The following is a generalized description of the etching process and its chemical parameters in relation to FIG. 2. This description is included to show the context in which the features described above are most likely to be used.

The apparatus and methods of this invention can be used in etching processes that are known in the art and in the literature. These processes include the use of dry-etch gases in general, including Cl2, HBr, HF, CCl2F2 and others. Preferred etchant gases, particularly for etching silicon, are gaseous halides (e.g. fluorides) such as noble gas fluorides, gaseous halogen fluorides, or combinations of gases within these groups (again, preferably without energizing the gas, other than heating to cause vaporization or sublimation). The noble gases are helium, neon, argon, krypton, xenon and radon, and among these the preferred fluorides are fluorides of krypton and xenon, with xenon fluorides the most preferred. Common fluorides of these elements are krypton difluoride, xenon difluoride, xenon tetrafluoride, and xenon hexafluoride. The most commonly used noble gas fluoride in silicon etch procedures is xenon difluoride. Halogen fluorides include bromine fluoride, bromine trifluoride, bromine pentafluoride, chlorine fluoride, chlorine trifluoride, chlorine pentafluoride, iodine pentafluoride and iodine heptafluoride. Preferred among these are bromine trifluoride, bromine trichloride, and iodine pentafluoride, with bromine trifluoride and chlorine trifluoride the more preferred. Combinations of bromine trifluoride and xenon difluoride are also of interest. The etch process is generally performed at a pressure below atmospheric. It is preferred that the etchants described herein be used in the gaseous state (e.g. non-plasma) or otherwise in the absence of added energy (except heat to aid sublimation or vaporization of the starting etchant gas or liquid), and in the absence of electric fields, UV light or other electromagnetic energy, or other added fields or energy sources which would energize the etchant gas beyond it's normal energy as a gas at a particular temperature.

The etch preferably utilizes an etchant gas capable of spontaneous chemical etching of the sacrificial material at room temperature, preferably isotropic etching that chemically (and not physically) removes the sacrificial material. In a preferred embodiment, the etchant is capable at room temperature of reacting with the sacrificial material and where the reaction product(s) is a gaseous component that is released from the sacrificial material surface due to being in a gaseous state. No UV or visible light or other electromagnetic radiation or electric fields are needed, or any energy that would energize the gas molecules to physically bombard and physically remove the sacrificial material. Though the etch could be performed with the application of heat or the presence of light from the room surrounding the etch chamber, the etchant is capable of spontaneously etching the sacrificial material at room temperature without any applied heat, visible, UV or other electromagnetic radiation, ultrasonic energy, electric or magnetic fields, etc. The etchant is preferably not broken down into atoms, radicals and/or ions by an rf glow discharge, the etchant is transported by diffusion to the surface of the material being etched (in addition to pumping—e.g. by recirculating the etchant repeatedly through the etching chamber), the etchant is adsorbed on the surface, a chemical reaction occurs between the etchant and the material being etched with the formation of a volatile product, and the product is desorbed from the surface and diffuses into the bulk of the gas and eventually exits the etching chamber. The apparatus, therefore, can be without a source of RF or microwave energy, though it is possible to run the process of the invention in a plasma apparatus without energizing the etchant to form a plasma. Or, as set forth in U.S. patent application 60/293,092 to Patel et al. filed May 22, 2001, a first energized (e.g. plasma) etch can be performed followed by a non-plasma vapor phase etch. Such an energized etch can be performed in a separate apparatus, in the same apparatus but in a different chamber than the vapor phase etch, or within the same chamber, preferably as a step prior to the vapor phase, non-plasma etch. It is also possible to perform a wet etch as a first etch, followed by a second vapor phase etch as set forth herein. the wet etch is preferably a clean, integrated circuit standard (fab compatible) wet chemical that is used to partially (or fully) remove silicon. The wet chemical preferably has good selectivity to metals and dielectrics common in an integrated circuit fab. In one embodiment of such a wet etch, the wet etchant is a photoresist remover, such as ACT, EKC, etc. The devices being etched can be immersed or sprayed with the photoresist stripper in one chamber, followed by the vapor phase etch in another—preferably without breaking vacuum or otherwise exposing the devices being etched to ambient.

Taking as an example BrCl3 in a vapor phase etch, a molecule of BrCl3 could hypothetically be placed next to a silicon molecule bound to other silicon molecules in crystalline silicon, polysilicon or in an amorphous silicon matrix. The bond energies of the Cl atoms to the Br atoms are sufficiently weak, and the bond energy of the silicon atom to other silicon atoms is sufficiently weak, and the attraction forces between Si and Cl are sufficiently strong, that without a physical bombardment of the BrCl3 on the silicon, Cl will disassociate from Br and bond to Si to form various products such as SiCl, SiCl2, SiCl3, SiCl4, etc., which etch products are a gas a room temperature and dissipate from the silicon surface, thus removing sacrificial silicon material. The same process occurs with XeF2, BrF3 and the other vapor phase spontaneous chemical etchants.

Such chemical etching and apparatus for performing such chemical etching are disclosed in U.S. patent application Ser. No. 09/427,841 to Patel et al. filed Oct. 26, 1999, in U.S. patent application Ser. No. 09/649,569 to Patel at al. filed Aug. 28, 2000, mentioned previously, and in U.S. patent application 60/293,092 to Patel et al. filed May 22, 2001 incorporated herein by reference. Preferred etchants for the etch are gas phase fluoride etchants that, except for the optional application of temperature, are not energized. Examples include gaseous acid etchants (HF, HCl, HI etc.), noble gas halides such as XeF2, XeF6, KrF2, KrF4 and KrF6, and interhalogens such as IF5, BrCl3, BrF3, IF7 and ClF3. It is also possible to use fluorine gas, though handling of fluorine gas makes this a less desirable option. The etch may comprise additional gas components such as N2 or an inert gas (Ar, Xe, He, etc.). In the etching process, except for optional heating, the gas is not energized and chemically etches the sacrificial material isotropically. In this way, the sacrificial material is removed and the micromechanical structure is released. In one aspect of such an embodiment, BrF3 or XeF2 are provided in a chamber with diluent (e.g. N2 and He). An initial plasma etch, preferably in a separate etching apparatus, can be performed prior to etching as set forth above. This sequential etch is set forth further in 60/293,092 to Patel et al. filed May 22, 2001, the subject matter of which is incorporated herein by reference.

Figure 4:
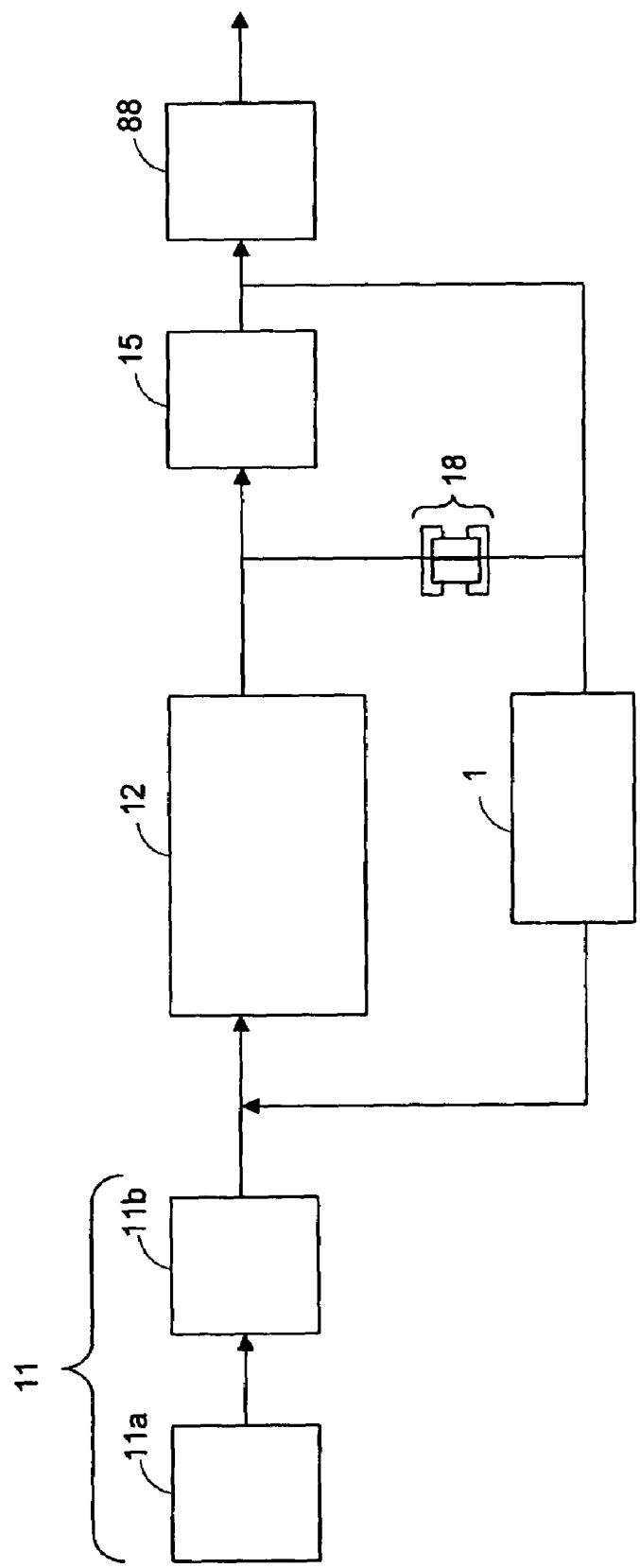
FIG. 4 is a process flow diagram for the apparatus of FIG. 2.

While the source chamber 11 can be a single chamber, the arrangement shown in FIG. 4 is an optional one in which the source chamber is actually a pair of chambers 11a and 11b arranged in series. The first of these chambers 11a contains the source material primarily in its condensed form, i.e., either as crystals to be sublimated or liquid to be vaporized. The second chamber 11b receives the source material gas evolved by sublimation from the crystals or by vaporization from the liquid in the first chamber 11a. To maintain these phases, the two chambers 11a and 11b will preferably be maintained at different temperatures (preferably at least 5 degrees C. difference), the former 11a at the lower temperature to keep the material in its condensed form (solid crystals or liquid) and the latter 11b at the higher temperature (and possibly a higher pressure as well) to keep the material in the vapor form (and to avoid the problem of condensation) at a pressure sufficiently high to allow it to be supplied to the succeeding chambers at the pressures needed in those chambers. In one embodiment, the two chambers are held at temperatures above room temperature, with chamber 11b held at a temperature from 2 to 24 degrees C. (preferably around 5 to 10 degrees C.) higher than the temperature of chamber 11a. Such a two-chamber embodiment could likewise be utilized in a system such as that illustrated in FIG.

1. Chambers 11*a* and 11*b* could also be arranged in parallel. Also shown in FIG. 4 are the expansion chamber 12, the etching chamber 15, and pumps 18 and 88.

The terms "sample" and "microstructure" are used herein to denote the article from which a material is sought to be removed or to which a material is to be added, whether the material forms a layer among a plurality of layers, layers among a plurality of layers or a region adjacent to other regions in the same plane. The "sample" may thus be a single mirror element and its associated layers of other materials, a test pattern, a die, a device, a wafer, a portion of a wafer, or any article from which a portion is to be removed or added. The invention is particularly suitable for processes where the size of the portion of material that is being added or removed is less than 5 mm in at least one of its dimensions, preferably less than 1 mm, more preferably less than 500 μm, and most preferably less than 100 μm. The invention is also well suited to adding or removing material (e.g., in the form of holes or layers) in a submicron environment (e.g. in the range of 10 nm to less than 1000 nm) (as sometimes needed, for example, in MEMS and MOEMS).

In the system depicted in the drawings, as well as other systems within the scope of this invention, a single charge of etchant can be placed in the source chamber or the expansion chamber, then released (with or without diluents) into the recirculation loop. Additional etchant can be introduced to replenish the circulating stream as the amount of etchant in the recirculation loop decreases over time. Other variations of the process will be apparent to those skilled in the art.

When the material to be removed by etching is silicon, certain etching processes supply the etchant gas as a mixture of gases of which one component is the etchant gas itself (or a mixture of etchant gases) while other components are non-etchant diluents. Whether the gas consists entirely of etchant gas(es) or contains non-etchant components as well, the rate of the etch reaction may vary with the partial pressure of the etchant gas. The partial pressure may vary, but in most applications, particularly those in which silicon is being etched, best results will be obtained with the etchant gas at a partial pressure of at least about 0.1 mbar (0.075 torr), preferably at least about 0.3 mbar (0.225 torr), more preferably within the range of from about 0.3 mbar (0.225 torr) to about 30 mbar (22.5 torr), and most preferably from about 1 mbar (0.75 torr) to about 15 mbar (11.25 torr). These pressure ranges are particularly applicable to xenon difluoride etching.

In certain processes, non-etchant gas additive(s) are included to increase the selectivity of the silicon etch. Preferred additives for this purpose are non-halogen-containing gases. A single such additive or a mixture of such additives can be used. In preferred embodiments of this invention, the additives are those whose molar-averaged formula weight (expressed in daltons or grams per mole) is less than the formula weight of molecular nitrogen, preferably about 25 or less, still more preferably within the range of from about 4 to about 25, still more preferably within the range of from about 4 to about 20, and most preferably within the range of from about 4 to about 10. If a single additive species is used, the "molar-averaged formula weight" is the actual formula weight of that species, whereas if two or more additive species are used in the same gas mixture, the molar-averaged formula weight is the average of the formula weights of each species in the mixture (exclusive of the noble gas fluoride) calculated on the basis of the relative molar amounts (approximately equal to the partial pressures) of each species. In terms of thermal conductivity, preferred additives are those whose thermal conductivity at 300 K (26.9° C.) and atmospheric pressure ranges from about 10 mW/(m K) (i.e., milliwatts per meter per degree Kelvin) to about 200 mW/(m K), and most preferably from about 140 mW/(m K) to about 190 mW/(m K). In general, the higher the thermal conductivity of the additive, the greater the improvement in selectivity. Examples of additives suitable for use in this invention are nitrogen (N2, thermal conductivity at 300 K: 26 mW/(m K)), argon (Ar, thermal conductivity at 300 K: 18 mW/(m K)), helium (He, thermal conductivity at 300 K: 160 mW/(m K)), neon (Ne, thermal conductivity at 300 K: 50 mW/(m K)), and mixtures of two or more of these gases. Preferred additive gases are helium, neon, mixtures of helium and neon, or mixtures of one or both of these with one or more non-etchant gases of higher formula weight such as nitrogen and argon. Particularly preferred additives are helium and mixtures of helium with either nitrogen or argon. Other additives/diluents that can be used in addition to noble gases are diatoms. Halogen diatoms such as Cl2, F2, Br2 and/or I2 can be used in place of or in addition to the diluents mentioned above. Other diatoms, such as O2 and H2 could also be used. The degree of selectivity improvement may vary with molar ratio of the additive to the etchant gas. Here again, the molar ratio is approximately equal to the ratio of the partial pressures, and in this case the term "molar ratio" denotes the ratio of the total number of moles of the additive gas (which may be more than one species) divided by the total number of moles of the etchant gas (which may also be more than one species). In most cases, best results will be obtained with a molar ratio of additive to etchant that is less than about 500:1, preferably within the range of from about 1:1 to about 500:1, preferably from about 10:1 to about 200:1, and most preferably from about 20:1 to about 150:1. In one example, the ratio is set at 125:1.

The temperature at which the etch process is conducted can likewise vary, although the partial pressure of the etchant gas will vary with temperature. The optimal temperature may depend on the choice of etchant gas, gaseous additive or both. In general, and particularly for procedures using xenon difluoride as the etchant gas, suitable temperatures will range from about −60° C. to about 120° C., preferably from about −20° C. to about 80° C., and most preferably from about 0° C. to about 60° C. For xenon difluoride, the silicon etch rate is inversely proportional to the temperature over the range of −230° C. to 60° C. The improvement in selectivity can thus be further increased by lowering the etch process temperature.

The flow parameters will be selected such that the time during which the sample will be exposed to the etchant gas will be sufficient to remove all or substantially all of the silicon. The expression "substantially all of the silicon" is used herein to denote any amount sufficient to permit the finished product to function essentially as effectively as if all of the silicon had been removed. An example of the structures to which this invention will be applied is that depicted in U.S. Pat. No. 5,835,256, incorporated herein by reference, in which a silicon nitride layer is deposited over a polysilicon layer, and the silicon nitride layer is patterned to leave vias that define the lateral edges of the mirror elements. Access to the sacrificial polysilicon layer is through the vias, and the etching process removes the polysilicon below the vias by etching in the vertical direction (i.e., normal to the planes of the layers) while also removing the polysilicon underneath the silicon nitride by etching in the lateral direction (parallel to the planes of the layers). The process is also effective for etching silicon relative to multiple non-silicon layers. Also, it should be noted that the silicon can contain impurities, and in particular may contain a large amount of hydrogen (e.g. up to 25 at % or more) depending upon the deposition method used.

The process design shown in FIG. 2 is but one of many designs in which good selectivity and/or end point detection in accordance with the present invention can be achieved. The FIG. 2 design itself can be used with many different combinations and sequences of valve openings and closings. One such sequence is as follows:

1. Solid or liquid etchant material (such as XeF2) is placed in the source chamber(s) 11.
2. A sample 14 is placed in the etch chamber 15.
3. The expansion chamber 12 and the etch chamber 15 are each evacuated.
4. The expansion chamber 12 and the etch chamber 15 are preconditioned by a) flooding one or both of the chambers with an inert gas (such as N2, for example), b) implementing a temperature ramp (e.g. consisting of raising the temperature of one or both of the chambers for fixed time followed by cooling the temperature of one or both chambers after step 5 and finishing with raising the temperature of one or both chambers after step 15), or c) both flooding and implementing temperature ramp. The sample temperature can be ramped to match or differ from than the chamber temperature ramp.
5. Both the expansion chamber 12 and the etch chamber 15 are then evacuated.
6. The expansion chamber 12 and the etch chamber 15 are then filled with one or more diluents from the individual gas sources 19, 20.
7. The expansion chamber 12 is then evacuated.
8. The expansion chamber 12 is then filled with XeF2 gas from the source chamber(s) 11 (generated by sublimation from the XeF2 crystals in the source chamber).
9. XeF2 gas is then pumped out of the expansion chamber 12 by the vacuum pump 23 to lower the XeF2 gas pressure in the expansion chamber to the desired XeF2 process pressure to be used for etching the sample.
10. One or more diluent gases from the gas sources 19, 20 are then added to the expansion chamber 12.
11. All valves are then closed except the manual needle valves.
12. The recirculation pump 18 is then activated to start a flow of diluent gas through the etch chamber 15. Also valves 3 and 5 are opened to allow part of the recirculating glass to flow through the gas analyzer.
13. The shutoff valves 26, 27 on the XeF2 recirculation loop are then opened to cause XeF2 gas to enter the recirculation loop 36.
14. Recirculation of the XeF2 gas through the etch chamber is continued until an end point to the etch is determined via the gas analyzer.
15. Both the expansion chamber 12 and the etch chamber 15 are then evacuated.
16. The expansion chamber 12 and the etch chamber 15 are post-conditioned by a) flooding one or both of the chambers with an inert gas, b) increasing the temperature of one or both of the chambers, c) pumping out one or both of the chambers, or d) following a time ordered sequence of one or more of flooding/heating/evacuating.
17. The finished sample is then removed from the etch chamber.

This procedure can be varied without detriment to the product quality. Steps 12 and 13, for example, can be performed in reverse order. Other variations will be apparent to those skilled in the art.

Example:

For etching a 6" glass substrate with MEMS devices, typical apparatus and process parameters include: double source chamber design with 11a at 28 C, 11b at 31 C and intermediate connector piece at 35 C. Expansion chamber 12 and etch chamber 15 at 23 C. In step 6 above, both chambers 12 and 15 are filled with a mixture of 45 T Nitrogen (N2) and 450 T Helium (He); total gas pressure is 495 T. In step 8, the chamber 12 is filled with XeF2 gas above 4.2 T. In step 9, the XeF2 gas in chamber 12 is reduced to 4 T for use in the process. In step 10, chamber 12 receives 47 T of Nitrogen (N2) and 470 T of Helium (He); total gas pressure in chamber 12 at the end of step 10 is 521 T.

End Point Detection:

As can be seen in Toda R., Minami K, and Esashi M., "Thin Beam Bulk Micromachining Based on RIE and Xenon Difluoride Silicon Etching", Transducers '97, IEEE, pp. 671–3, Fourier Transform spectroscopy is used to monitor the etching of silicon by xenon difluoride. The process is run in pulse mode where the etchant gas enters the etching chamber at the beginning of the etch, and the etching chamber is evacuated only at the end of the etch. There is a slow build up of SiF4 in the chamber which gradually forms a plateau as the etch nears completion. With such an arrangement it is very difficult to determine where along the plateau is the proper end point. As stated in the reference, it is considered that the reaction between XeF2 and silicon is mostly finished within 30 seconds after the SiF4 absorption peak is nearly saturated. Attempting to pinpoint an end point on the plateau of the curve of SiF4 is more of a guess than an actual calculated end point determination.

Another XeF2 etching method is a flow through system where an unimpeded gas flows out of the etching chamber at substantially the same rate as etchant flows into the etching chamber. Such a system is disclosed in EP 0878824 to Surface Technology Systems. If a gas analyzer were to be placed at or downstream from the etching chamber for analyzing etching products from the etching reaction, due to a lack of impeding the gas flow out of the etching chamber in accordance with the invention, only noise would be detected by such a hypothetical arrangement (see FIG. 8).

In accordance with the present invention, whether the etch system is a flow through continuous (or at least partially continuous) system, or a recirculation etch system, a gas analyzer is provided that is capable of accurately detecting an end point of the etching reaction. Whether the gas flow is recirculated or vented to ambient, it is desirable that the gas flow into the etching chamber be impeded. The impedance can be any impedance as long as it is greater than 0 (as in the flow through system mentioned above) and less than infinite (as in the pulse system mentioned above). The flow can be continuous or partially continuous (stop-start), though a pure pulse mode is not desirable for detecting end point in accordance with the invention).

The gas analyzer can be any suitable analyzer that is capable of detecting etch products such as gaseous SiFx molecules in a gas stream. Residual Gas Analyzers (RGA's) are available from AMETEK, Anglo Scientific, Ferran Scientific, Hiden Analytical, VG Gas Analysis Systems and Stanford Research Systems. Depending upon the etch product, many gas analysis systems could be used, including UV and visible spectrometers, Raman Spectrometers, NRM Spectrometers, Mass Spectrometers, Infrared and Fourier Transform Infrared, or Atomic Spectrometers. Unit EPDI 704 Endpoint Monitor by MKS is particularly useful in the present invention.

Figure 5:
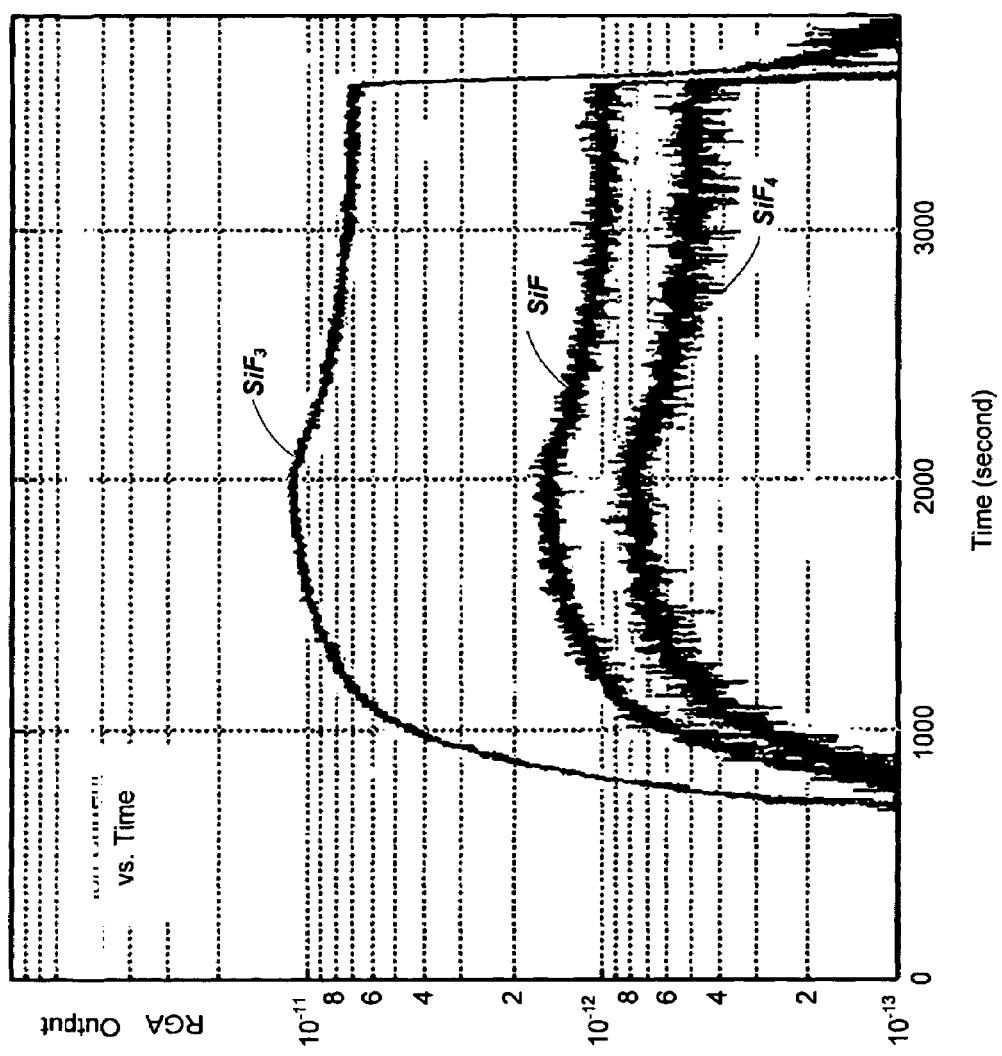
FIG. 5 is a graph of the partial pressure (ion current in a residual gas analyzer) of different etching products vs. time in the invention.
Figure 8:
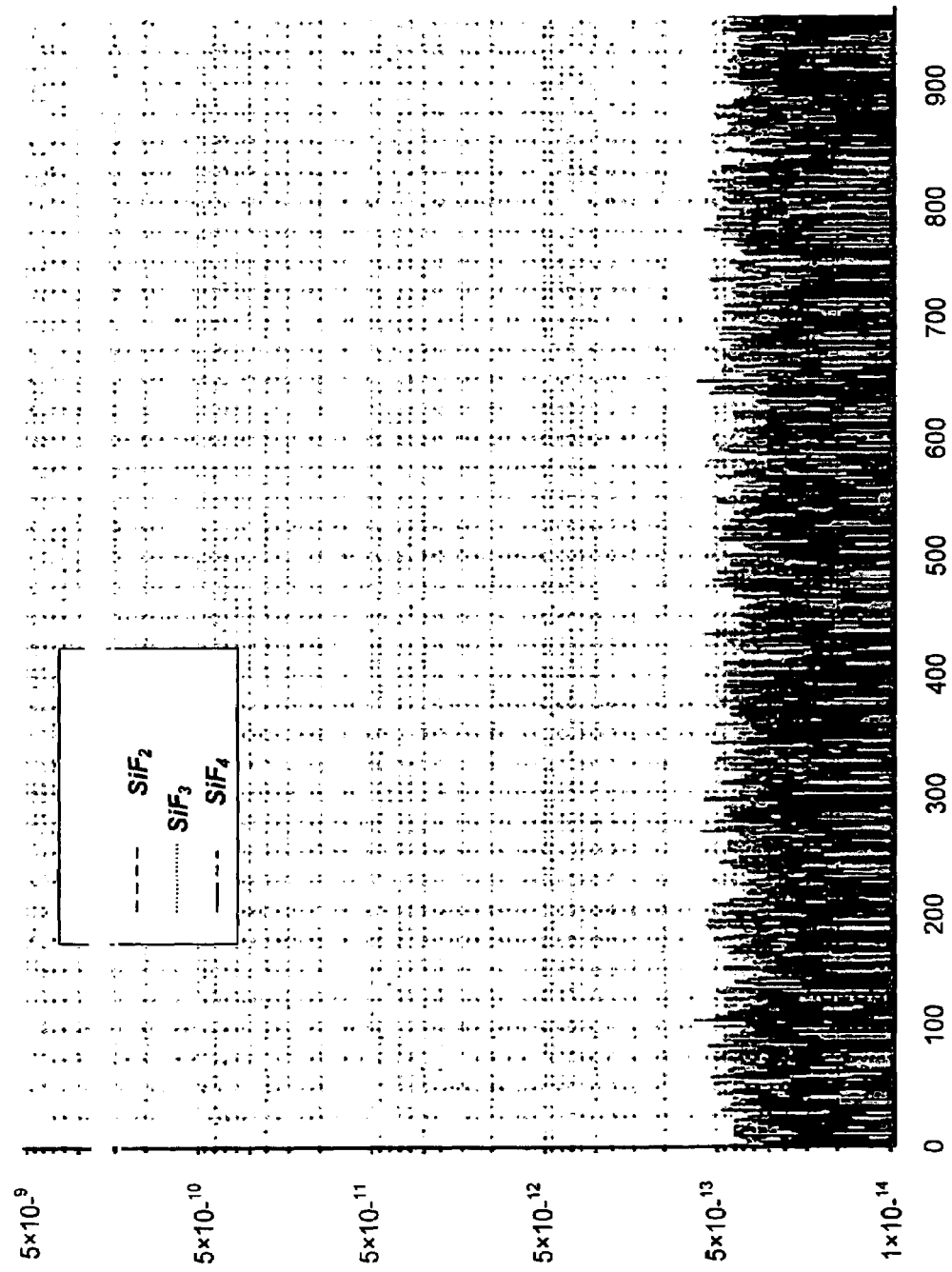
FIG. 8 is a graph of the partial pressure (ion current in a residual gas analyzer) of different etching products vs. time in a prior art method and apparatus.

When gas outflow is impeded from the etching chamber as above, gas components monitored in a gas analyzer, particularly gaseous etching products, increase and then decrease. As can be seen in FIG. 5, etching products SiF3, SiF and SiF4 increase in amount (ion current in a residual gas analyzer—RGA) up to a point around 2000 seconds, which is the end point of the reaction. After 2000 seconds, the etching product amounts that are detected in the RGA decrease. The increase in the initial curve is not found in a flow through system (as can be seen in FIG. 8) and the decrease at the end point is not found in pulse systems (as can be seen in FIG. 3 of the R. Toda reference mentioned above).

Figure 6A:
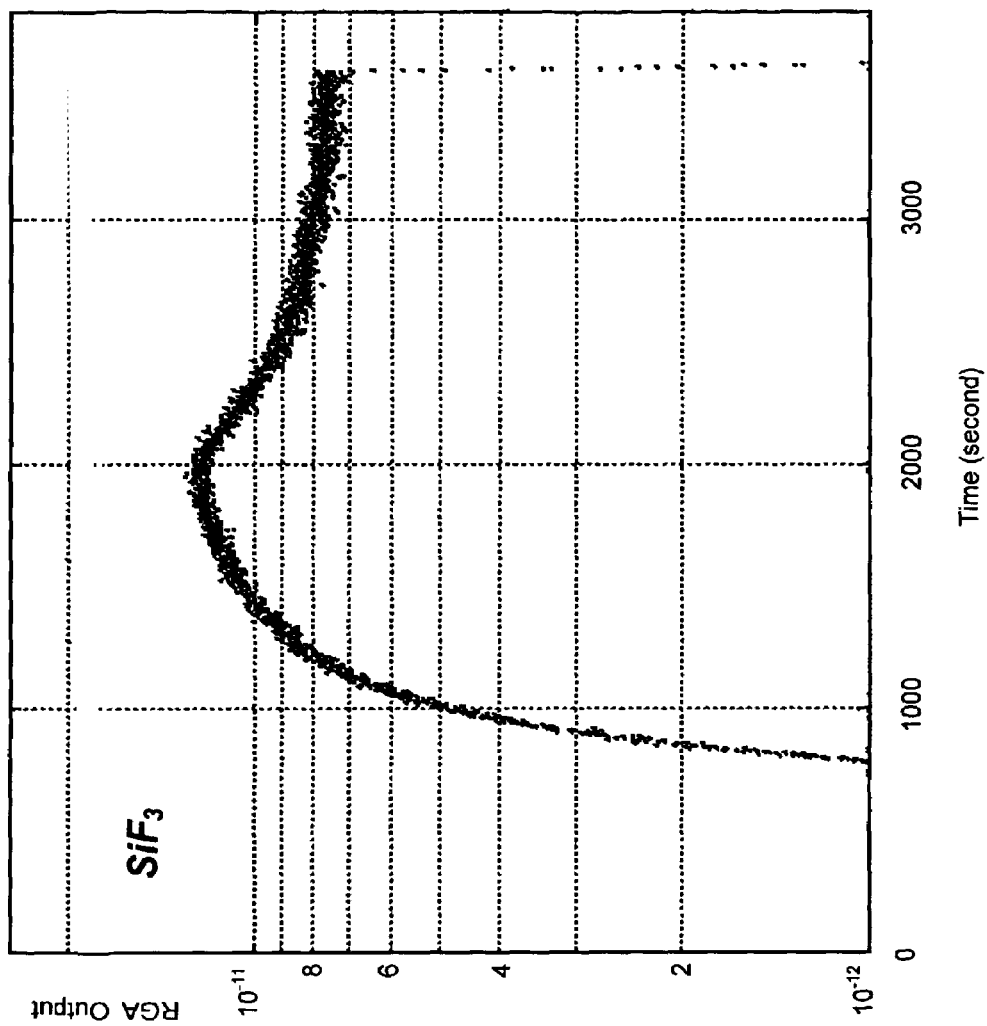
FIG. 6A is a graph of the partial pressure of SiF3 vs. time.
Figure 6B:
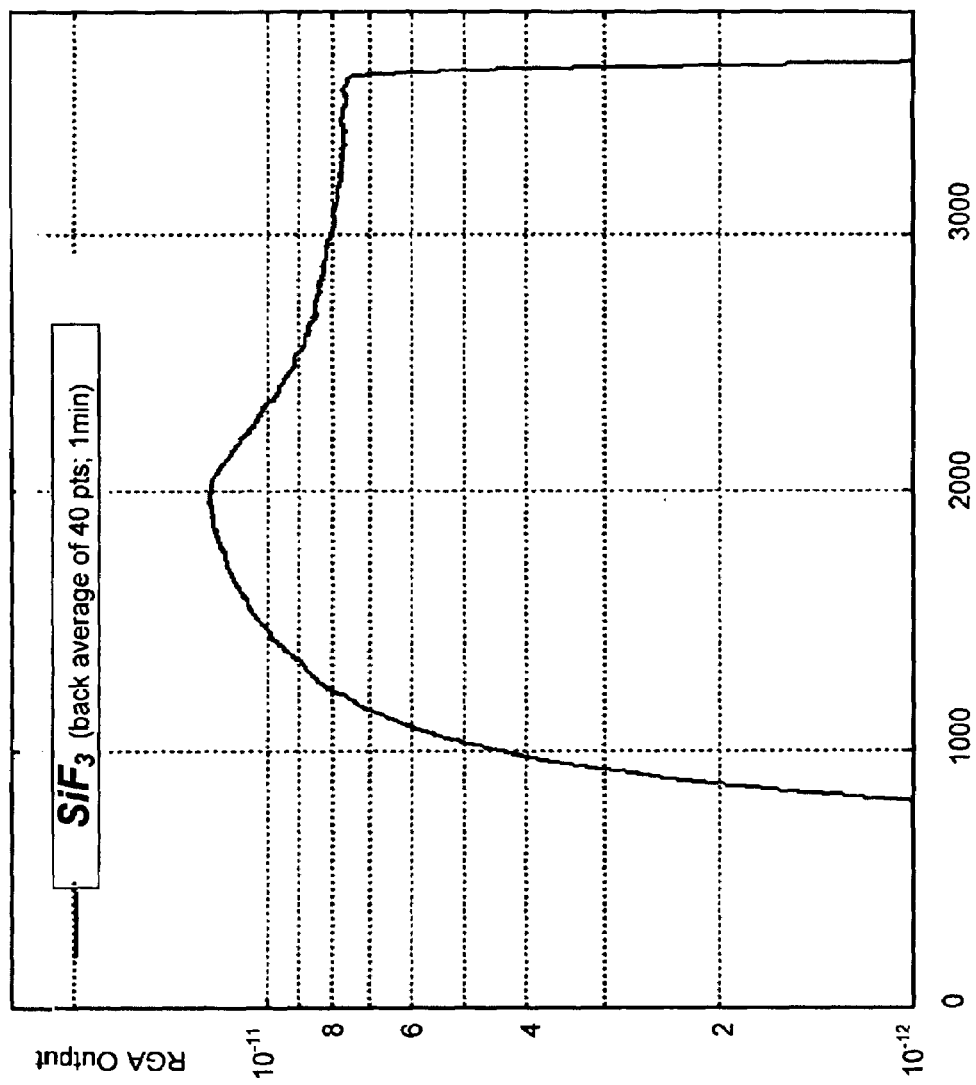
FIG. 6B is a graph of the data of FIG. 6A back averaged over 40 previous data points.

Taking SiF3 as an example, as can be seen in FIG. 6A, the data from the RGA forms a rising then falling curve as also illustrated in FIG. 5. If these data are back averaged (e.g. with the previous 40 data points, a smoother curve results as shown in FIG. 6B Because the average is an average with previously acquired data, this averaging can take place in real time. The new averaged data of FIG. 6B can be used to take a derivative (the rate of change of the etching product), which is the data shown in FIG. 7A. This data can also be back averaged (over 40 data points) to result in the curve shown in FIG. 7B. It is also possible to further process the curves of FIG. 6B and/or FIG. 7B with additional curve smoothing techniques as known in the art.

An accurate end point can be determined visually by a system operator monitoring the curves of one or more etching products on a computer monitor or print-out, or preferably, the end point is automatically determined based on the data from the gas analyzer. In a preferred embodiment, the end point is flagged (audio signal or visual alert). The end point can be determined in a number of ways. As can be seen in FIG. 6B, the RGA output increases and then decreases at a time around 2000 sec (2000 sec is arbitrary and depends upon the amount of sacrificial material being etched, the etchant concentration, process temperature and pressure, etc.). A software program can be used to look for a peak value from the gas analyzer (corresponding roughly to the datum at time 2000 sec.) or to look for a decrease (or average decrease over time)—also taking place at around 2000 sec. in the example in FIG. 6B. In one method of the invention, the end point is detected after the signal from the gas analyzer decreases for ¾ of all data points in a 25 to 40 point range. In another way of determining the end point, the back-averaged data of FIG. 6B is again averaged over, e.g. 10 data points or more, consecutively along the curve, and when the average of any group of 10 (or more) data points is lower than the previous 10 point average, the end point is flagged.

Figure 7A:
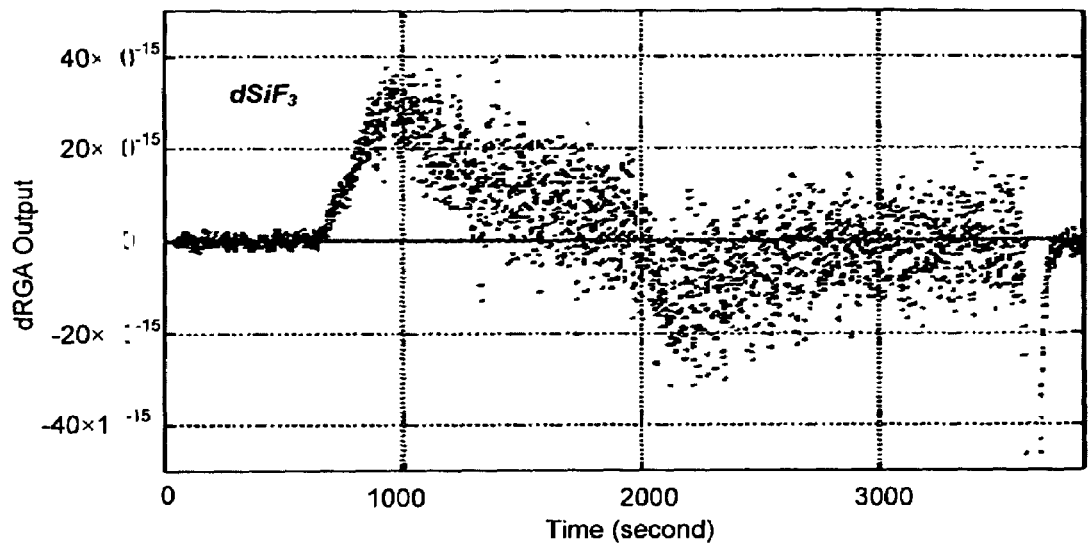
FIG. 7A is a graph of the derivative taken from the data of FIG. 6B.
Figure 7B:
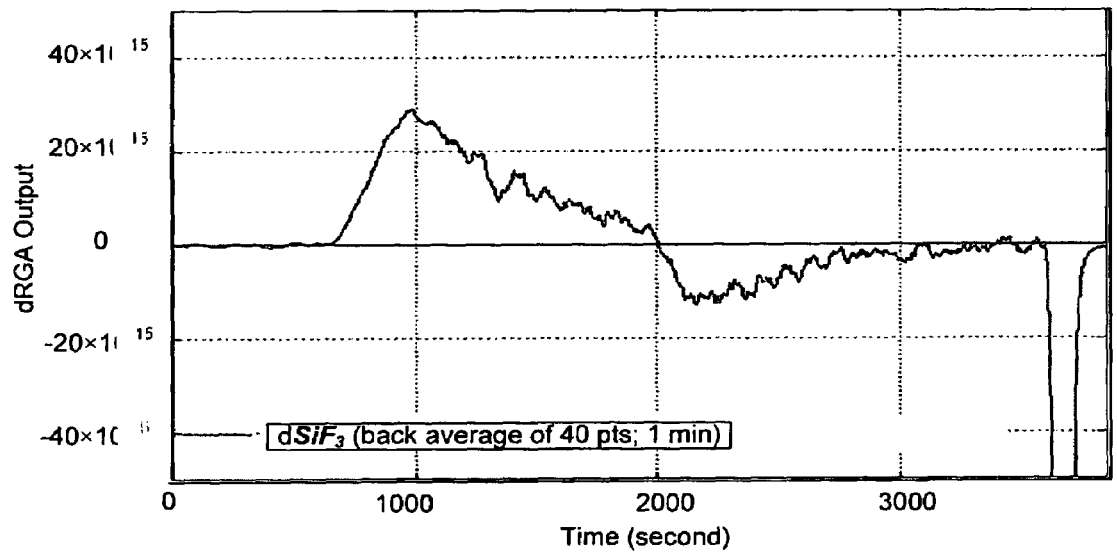
FIG. 7B is a graph of the data of FIG. 7A back averaged over 40 previous data points.

As seen in FIGS. 7A and 7B, the derivative of the data in FIG. 6B can be taken (FIG. 7A) and then back averaged (FIG. 7B). Because graph 7B indicates the rate of change of the data of the gas analyzer, similar to the discussion above with respect to FIG. 6B, when the rate of change passes across point 0 (again at time 2000 sec. in FIG. 7B) this indicates that the rate of change of the detected etch product is no longer increasing and is, in fact decreasing. Crossing from positive to negative values in FIG. 7B can be monitored and flagged as the end point of the etching reaction.

At the determined end point, if the method is being run in real time, in a preferred embodiment, the etch process is stopped—the bleeding of etchant into the expansion chamber (or etching chamber if there is no expansion chamber) is stopped, and any etchant and etch products are vented out of the etching chamber with an inert gas (e.g. N2, Ne or Ar). It is also possible, upon determination of the end point as above, to allow the etching reaction to proceed for a predetermined period of time T (e.g. 20 to 100 seconds), in order to allow for slight over-etching in the etch process. The stopping of the etch process upon end point determination can be made manually or automatically.

Sacrificial silicon layers that can be removed using the apparatus and method of this invention may be layers of crystalline silicon, amorphous silicon, partially crystalline silicon, crystalline silicon of multiple crystal sizes, polysilicon in general, and silicon doped with such dopants as arsenic, phosphorus or boron. Amorphous silicon and polysilicon are of particular interest, although the relative crystalline vs. amorphous character of polysilicon will vary considerably with the deposition conditions, the presence or absence of dopants and impurities, and the degree of annealing.

Silicon can be preferentially removed relative to non-silicon materials by the method and apparatus of this invention. The term "non-silicon material" denotes any material that contains neither amorphous nor crystalline silicon in any of the forms described in the preceding paragraph. Non-silicon materials thus include silicon-containing compounds in which elemental silicon is bonded to another element, as well as non-silicon elements and compounds of non-silicon elements. Examples of such non-silicon materials are titanium, gold, tungsten, aluminum, and compounds of these metals, as well as silicon carbide, silicon nitride, photoresists, polyimides, and silicon oxides. Silicon nitride and silicon oxide are of particular interest in view of their use in the structures disclosed in U.S. Pat. No. 5,835,256. Two or more different non-silicon materials may be present in a single structure, and selectivity of the silicon etch relative to all such non-silicon materials will be improved.

When the present invention is applied to the mirror structures disclosed in U.S. Pat. No. 5,835,256, to remove silicon layers from those structures, the thickness and lateral dimensions of the layers may vary. The silicon portion will generally however be a layer having a thickness of from about 200 nm to about 5,000 nm, preferably from about 250 nm to about 3,000 nm, and most preferably from about 300 nm to about 1,000 nm, though of course any thickness of material can be etched as desired. Similarly, the non-silicon portion will generally be a layer with a thickness of from about 10 nm to about 500 nm, preferably from about 20 nm to about 200 nm, and most preferably from about 30 nm to about 200 nm, though many structural materials having different dimensions are possible. The lateral distance that the etching process must extend under the typical silicon nitride mirror element in the structures of U.S. Pat. No. 5,835,256 in order to remove all of the underlying polysilicon (this distance typically being half the shortest lateral dimension of the mirror when the etching front travels inward from opposing edges) may range from a submicron distance to about 500 microns, preferably from about 3 microns to about 30 microns, and most preferably from about 5 microns to about 15 microns.

While much of the foregoing description is directed to applications of the present invention to etching processes, the invention, and particularly its recirculation aspect, is applicable in general to processes for adding or removing layers within a device, particularly layers that have microscopic dimensions. Examples of such processes are passivation and etching of semiconductor devices and MEMS (including MOEMS) devices, lithography (screen printing, for example), thin-film deposition (chemical vapor deposition e.g. application of self-assembled monolayers and sputtering, for example), electroplating (blanket and template-delimited electroplating of metals, for example), and directed deposition (as used in electroplating, stereolithography, laser-driven chemical vapor deposition, screen printing, and transfer printing, for example). Further examples are plasma etching, reaction-ion enhanced etching, deep reactive ion etching, wet chemical etching, electron discharge machining, bonding (such as fusion bonding, anodic bonding, and the application of adhesives), surface modification (such as wet chemical modification and plasma modification), and annealing (such as thermal or laser annealing). The process gases in each case will be readily apparent to those skilled in the respective arts. The present invention is also useful in processes where at least one of the components of the process gas is corrosive to metal in the presence of water vapor. Corrosive components can be used for adding or removing material in a microscopic device without picking up impurities that will lower the product yield and that might damage the pump used in the recirculation loop.

Further variations within the scope of the present invention are as follows. The recirculation loop 36 of FIG. 2 can be expanded to include the source chamber(s) 11. A valve arrangement can be incorporated into the design that allows the operator to choose between placing the source chamber within the recirculation loop and isolating the source chamber from the recirculation loop. Similarly, diluent gas can be added to the recirculation loop simultaneously with the process gas, and an appropriate valve arrangement can be incorporated that would provide the operator with the option to do so. Appropriate valve arrangements can also provide the option of extending the recirculation loop 36 through the etch chamber 15 only or through both the etch chamber 15 and the expansion chamber 12.

As also noted above, a filter 39 can be placed in the recirculation loop 36 to filter out at least one (and preferably all) of the byproducts or effluent produced by the reactions occurring in the etch chamber 15. This improvement may be applied to an etching or deposition process with or without energetically enhancing the process gas. A selective filter that allows the process gas to pass would be preferred. Of course, the filter can be a basic particulate filter as well. Again, these are only examples. Other variations and modifications will be readily apparent to those skilled in the art. For example, the end point calculations can take into account not only the data from the gas analyzer, but also additional data if collected, such as data from previously run samples, change in sample weight, optical monitoring of the samples, etc. Use of neural networks for end point detection are disclosed in, for example, Liamanond, S., Si, J., Yean-Ling Tseng, "Production data based optimal etch time control design for a reactive ion etching", IEEE Trans. on Semic. Manufact., 2/99, vol 12, no.1, p. 139–47, where neural networks are used to model the functional relationship between an end point detection signal from an RIE process, as well as various in situ measurements, and the resulting film thickness remaining.

Though the apparatus and process disclosed herein are for etching a material from any work piece (semiconductor device, MEMS device, device to be cleaned of silicon residue, etc.), in one embodiment the material being removed is a sacrificial layer in a MEMS fabrication process. A specific example of a MEMS device that could be made in accordance with the invention is a micromirror array such as disclosed in U.S. Pat. Nos. 5,835,256 and 6,046,840 to Huibers et al. The method of making micromirrors could be that set forth in U.S. patent application Ser. No. 09/767,632 to True et al., filed Jan. 22, 2001 or Ser. No. 09/631,536 to Huibers et al. filed Aug. 3, 2001. The MEMS device, of course, could be any device, including movable mirror elements for optical switching such as disclosed in U.S. patent application Ser. 09/617,149 to Huibers et al. filed Jul. 17, 2000. The materials that are not etched can be as described herein, or such as described in U.S. patent application Ser. No. 09/910,537 to Reid filed Jul. 20, 2001 or in U.S. patent application 60/300,533 to Reid filed Jun. 22, 2001. Each of the above patents and applications are incorporated herein by reference.

Selectivity:

The improved selectivity in the present invention is related to an etch rate that is slower than in the prior art. In one embodiment of the invention, the etch rate is less than 30 um/hr, and preferably less than 27.7 um/hr. Slower etch rates can achieve better selectivity in the present invention, and etch rates as low as 10 um/hr or less, or even 7.2 um/hr or less can be performed for even greater improvements in selectivity. Though total process time is impacted, etch rates as low as 3 um/hr or less, 2 um/hr or less, or even 1 um/hr or less are within the scope of the invention. Of course within all ranges above, the etch rate is greater than 0.

Reducing the etch rate in the present invention can be achieved by altering one or more of the etch parameters known to effect etch rate (e.g. etchant concentration, pressure, temperature, etc.). It is not as important which parameter(s) is used to achieve the low etch rate as long as the etch depth per time is within the low ranges as set forth herein. Selectivity, depending upon the etch rate, can be 500:1 (relative to a "non silicon" material, such as a silicon compound—e.g. silicon nitride or silicon oxide), 1000:1, 2000:1 or even 10,000:1 or higher depending upon the etch rate and the non-silicon material.

The selectivity of the etch can be further improved by use of diluents with the gas phase chemical etchant. The etch selectivity is increased by using as the etching medium a gas mixture containing the etchant gas(es) and one or more of certain additional but non-etchant gaseous components. While the inclusion of non-etchant gaseous additives causes prolongation of the etch time, those additives whose molar-averaged formula weight is below that of nitrogen gas prolong the etch time to a much lesser extent than do those whose molar-averaged formula weight is equal to or greater than that of molecular nitrogen, while still achieving the same improvement in selectivity. The improvement in selectivity is achievable independently of the partial pressure of the etchant gas in the gas mixture. Likewise, the limitation on the increase in etch time when the averaged formula weight of the additive gas is less than that of molecular nitrogen is achievable independently of the partial pressure of the etchant gas in the gas mixture. Both the increase in selectivity and the limitation on the etch time are sufficiently great that significant improvements in uniformity, yield, and product reliability are achieved.

These discoveries offer numerous advantages, for example in overetching, i.e., etching purposely done to a degree beyond that which is strictly required for removal of the sacrificial silicon.

Since the high selectivity allows one to overetch without introducing nonuniformity across the mirror array, this invention permits the use of overetching as a convenient and effective means of assuring complete removal of the sacrificial silicon while still preserving the integrity of the mirror elements. The invention thus eases the requirement for precise end point detection, i.e., precise detection of the point at which the last of the sacrificial silicon is removed. Another advantage stems from the dilution effect of the additive gas. Dilution improves the circulation of the gaseous mixture through the system by adding to the mass that flows through the recirculation system or agitator when such pieces of equipment are present. Also, the presence of the additive gas helps reduce high local concentrations of the etchant at the sample surface. Each of these factors improves microstructure uniformity and yield.

This aspect of the invention is of particular interest in etching processes that are not performed in a plasma environment, i.e., etching processes performed without the use of externally imposed energy such as ultraviolet light or high frequency electromagnetic energy to excite the gases into a plasma state. The invention is also of particular interest in isotropic etching processes, notably those in which the silicon and the non-silicon portions (as defined below) of the microstructure are overlapping layers, coextensive or otherwise, or nonoverlapping layers, sharing a common boundary or separated but still simultaneously exposed to the etchant gas. The invention is particularly useful in structures in which the silicon is a layer positioned underneath a layer of the non-silicon material such that removal of the silicon by etching requires lateral access through vias in the non-silicon layer. The invention is also of particular interest in the manufacture of reflective spatial light modulators of the type described in U.S. Pat. No. 5,835,256, in which the mirror elements are formed of silicon nitride or silicon dioxide and the underlying sacrificial layer serving as the support to be removed by etching is polysilicon.

As mentioned previously, etching processes addressed by this invention are those in which the etchant is one or more gaseous noble gas fluorides, one or more gaseous halogen fluorides, or combinations of gaseous noble gas fluorides and halogen fluorides. The noble gases are helium, neon, argon, krypton, xenon and radon, and among these the preferred fluorides are fluorides of krypton and xenon, with xenon fluorides the most preferred. Common fluorides of these elements are krypton difluoride, xenon difluoride, xenon tetrafluoride, and xenon hexafluoride. The most commonly used noble gas fluoride in silicon etch procedures is xenon difluoride. Halogen fluorides include bromine fluoride, bromine trifluoride, bromine pentafluoride, chlorine fluoride, chlorine trifluoride, chlorine pentafluoride, iodine pentafluoride and iodine heptafluoride. Preferred among these are bromine trifluoride, bromine trichloride, and iodine pentafluoride, with bromine trifluoride and chlorine trifluoride the more preferred. Combinations of bromine trifluoride and xenon difluoride are also of interest.

The gas mixture is preferably contacted with the sample at a pressure below atmospheric pressure. The term "sample" is used herein to denote the article from which the sacrificial silicon is sought to be removed in a selective manner relative to other materials which may reside in separate layers or regions of the article. The "sample" may thus be a single mirror element and its associated layers of other materials, a test pattern, a die, a device, a wafer, a portion of a wafer, or any article containing sacrificial silicon. While the rate of the etching reaction may vary with the partial pressure of the etchant gas, the partial pressure is generally not critical to the invention and may vary. In most applications, best results will be obtained with the etchant gas at a partial pressure of at least about 0.1 mbar (0.075 torr), preferably at least about 0.3 mbar (0.225 torr), more preferably within the range of from about 0.3 mbar (0.225 torr) to about 30 mbar (22.5 torr), and most preferably from about 1 mbar (0.75 torr) to about 15 mbar (11.25 torr). These pressure ranges are particularly applicable to xenon difluoride.

The gaseous additive that is included in the gas mixture to increase the selectivity of the silicon etch is a gas that is not itself active as an etching agent, and preferably a non-halogen-containing gas. The additive may be a single species or a mixture of species. In preferred embodiments of this invention, the additives are those whose molar-averaged formula weight (expressed in daltons or grams per mole) is less than the formula weight of molecular nitrogen, preferably about 25 or less, still more preferably within the range of from about 4 to about 25, still more preferably within the range of from about 4 to about 20, and most preferably within the range of from about 4 to about 10. If a single additive species is used, the "molar-averaged formula weight" is the actual formula weight of that species, whereas if two or more additive species are used in the same gas mixture, the molar-averaged formula weight is the average of the formula weights of each species in the mixture (exclusive of the noble gas fluoride) calculated on the basis of the relative molar amounts (approximately equal to the partial pressures) of each species. In terms of thermal conductivity, preferred additives are those whose thermal conductivity at 300 K (26.9° C.) and atmospheric pressure ranges from about 10 mW/(m K) (i.e., milliwatts per meter per degree Kelvin) to about 200 mW/(m K), and most preferably from about 140 mW/(m K) to about 190 mW/(m K). In general, the higher the thermal conductivity of the additive, the greater the improvement in selectivity. Examples of additives suitable for use in this invention are nitrogen ($N_2$, formula weight: 28; thermal conductivity at 300 K: 26 mW/(m K)), argon (Ar, formula weight: 40; thermal conductivity at 300 K: 18 mW/(m K)), helium (He, formula weight: 4; thermal conductivity at 300 K: 160 mW/(m K)), neon (Ne, formula weight: 20; thermal conductivity at 300 K: 50 mW/(m K)), and mixtures of two or more of these gases. For embodiments in which the molar-averaged formula weight is below that of molecular nitrogen, the preferred additive gas is helium, neon, mixtures of helium and neon, or mixtures of one or both with one or more of higher formula weight non-etchant gases such as nitrogen and argon. Particularly preferred additives are helium and mixtures of helium with either nitrogen or argon.

The degree of selectivity improvement may vary with molar ratio of the additive to the etchant gas, but this ratio is generally not critical to the utility of this invention. Here again, the molar ratio is approximately equal to the ratio of the partial pressures, and in this case the term "molar ratio" denotes the ratio of the total number of moles of the additive gas (which may be more than one species) divided by the total number of moles of the etchant gas (which may also be more than one species). In most cases, best results will be obtained with a molar ratio of additive to etchant that is less than about 500:1, preferably within the range of from about 1:1 to about 500:1, preferably from about 10:1 to about 200:1, and most preferably from about 20:1 to about 100:1.

The temperature at which the etch process is conducted is likewise not critical to this invention. The temperature does however affect the partial pressure of the etchant gas and the optimal temperature may depend on the choice of etchant gas, gaseous additive or both. In general, and particularly for procedures using xenon difluoride as the etchant gas, suitable temperatures will range from about −60° C. to about 120° C., preferably from about −20° C. to about 80° C., and most preferably from about 0° C. to about 60° C. For xenon difluoride, the silicon etch rate is inversely proportional to the temperature over the range of −230° C. to 60° C. The improvement in selectivity can thus be further increased by lowering the etch process temperature.

The duration of the exposure of the sample to the gas mixture in the practice of this invention will be the amount of time sufficient to remove all of the silicon or substantially all, i.e., any amount sufficient to permit the microstructure to function essentially as effectively as if all of the silicon had been removed. An advantage of the high selectivity achieved with this invention is that it permits overetching of the silicon without significant loss of the non-silicon material. The time required for the etching process will vary with the amount of silicon to be removed and the dimensions and geometry of the silicon layer, and is not critical to this invention. In most cases, best results will be achieved with an exposure time lasting from about 30 seconds to about 30 minutes, preferably from about 1 minute to about 10 minutes. An example of the structures to which this invention will be applied is that depicted in U.S. Pat. No. 5,835,256, in which a silicon nitride layer is deposited over a polysilicon layer, and the silicon nitride layer is patterned to leave vias that define the lateral edges of the mirror elements. Access to the sacrificial polysilicon layer is through the vias, and the etching process removes the polysilicon below the vias by etching in the vertical direction (i.e., normal to the planes of the layers) while also removing the polysilicon underneath the silicon nitride by etching in the lateral direction (parallel to the planes of the layers).

In certain procedures within the scope of this invention, the manner and the order in which the gases in the gas mixture are combined may have an effect on the quality of the finished product. Variations may thus be introduced in the order of combining the etchant gas with the non-etchant diluent or whether this is done in portions, or, when two or more non-etchant diluents are used, the decision to combine one diluent with the etchant gas before adding the other diluent, or which diluent or subcombination is the first to contact the sample. Such variations may affect parameters of the process such as the diffusion time, the reaction rate at the surface of the sample, and the rate of removal of reaction products from the surface.

The sacrificial silicon layers to which this invention is applicable may be crystalline silicon, amorphous silicon, partially crystalline silicon, crystalline silicon of multiple crystal sizes, polysilicon in general, and silicon doped with such dopants as arsenic, phosphorus or boron. Polysilicon is of particular interest, although the relative crystalline vs. amorphous character of polysilicon will vary considerably with the deposition conditions, the presence or absence of dopants and impurities, and the degree of annealing.

The term "non-silicon" as used herein denotes any material that does not contain either amorphous or crystalline silicon in any of the forms described in the preceding paragraph. The term thus includes silicon-containing compounds in which elemental silicon is bonded to another element, as well as non-silicon elements and compounds of non-silicon elements. Examples of such non-silicon materials are titanium, gold, tungsten, aluminum, and compounds of these metals, as well as silicon carbide, silicon nitride, and silicon oxides. Silicon nitride and silicon oxide are of particular interest in view of their use in the structures disclosed in U.S. Pat. No. 5,835,256. Two or more different non-silicon materials may be present in a single structure, and selectivity of the silicon etch relative to all such non-silicon materials will be improved.

The thickness and lateral dimensions of the layers are also noncritical to the improvement in selectivity achieved by this invention. In most cases, the silicon portion will be a layer having a thickness of from about 200 nm to about 5,000 nm, preferably from about 250 nm to about 3,000 nm, and most preferably from about 300 nm to about 1,000 nm. Similarly, in most cases the non-silicon portion will be a layer with a thickness of from about 10 nm to about 500 nm, preferably from about 20 nm to about 200 nm, and most preferably from about 30 nm to about 200 nm. The lateral distance that the etching process must extend under the typical silicon nitride mirror element in the structures of U.S. Pat. No. 5,835,256 in order to remove all of the underlying polysilicon (this distance typically being half the shortest lateral dimension of the mirror when the etching front travels inward from opposing edges) may range from a submicron distance to about 100 microns, preferably from about 3 microns to about 30 microns, and most preferably from about 5 microns to about 15 microns.

The sample being etched comprises a layered structure formed on a quartz plate measuring 11.3 mm×15.6 mm. The first layer was a continuous polysilicon layer deposited directly on one side of the quartz, and the second layer was patterned silicon nitride deposited directly over the polysilicon layer. The polysilicon layer measured 9.2 mm×12.3 mm in lateral dimensions and was centered on the quartz surface, thereby leaving border regions along all four sides, and had a thickness of 0.5 micron. The silicon nitride layer was 249 nm (0.249 micron) in thickness and was coextensive with the quartz plate, thereby extending over both the underlying polysilicon layer and the border regions where no polysilicon had been deposited. The silicon nitride layer was patterned to form an array of square mirrors measuring 12 microns on each side with each pair of adjacent mirrors separated by a via 0.8 micron in width to expose the underlying polysilicon. Measurements of the thickness of the silicon nitride layer to assess the selectivity of the polysilicon etch were performed at four locations in the border regions, close to the four corners of the quartz plate, these locations being spaced apart from the edge of the polysilicon layer by distances greater than 300 microns. This distance was chosen to assure, for purposes of uniformity, that the measurement locations experienced no temperature rise from the exothermic polysilicon etch reaction, since the thermally insulating nature of silicon nitride precluded any such temperature rise at locations beyond approximately 100 microns from the edge of the polysilicon layer.

The time required for full removal of the polysilicon layer was determined by visual observation, as indicated above. The thickness of the silicon nitride at the measurement locations was determined both before and after the polysilicon etching by a common industry method of thin-film measurement using the reflectance of the film (as used in the NanoSpec Thin Film Measurement System of Nanometrics, Inc., Sunnyvale, Calif., USA, and in the Advanced Thin Film Measurement Systems of Filmetrics, Inc., San Diego, Calif., USA). Measurements were performed on two or three samples for each experiment, and the results averaged. The results are listed in the table below, which include as the first experiment a control run with xenon difluoride alone and no additive.

Experimental Results

| Experiment No. | No. of Samples | Gas in 1st Gas Source | Gas in 2d Gas Source | Time Required for Removal of Polysilicon | $Si_3N_4$ Thickness Loss (Initial Thickness 249 nm) During Polysilicon Removal |
|---|---|---|---|---|---|
| I | 3 | none | none | 65 sec | 11–13 nm |
| II | 3 | $N_2$ | $N_2$ | 610 sec | 2–3 nm |
| III | 2 | Ar | Ar | 590 sec | 2–3 nm |
| IV | 2 | He | He | 250 sec | 2–3 nm |

With the etching of the underlying polysilicon layer in the lateral direction, the etching distance of the polysilicon was one-half the width of each mirror element, or 0.5×12 microns=6,000 nm. The results in the table indicate that the selectivity of the etch of polysilicon relative to silicon nitride rose from approximately 500:1 (6,000 nm:11 nm) with the xenon difluoride-only etch medium in Experiment I to approximately 2,000:1 (6,000 nm:3 nm) with the addition of each of the additive gases in Experiments II, III and IV, and that the increase in etch time of the polysilicon when the additive was helium (Experiment IV) was well under half the attendant increases when the additives were nitrogen and argon, both of which had formula weights exceeding 25. These diluents are but examples, and any diluent or combination of diluents can be used, though preferably as long as the etch rate is within the low etch rate ranges of the invention.

As can be seen from the above various etch rates can be used to remove the sacrificial layer, including an etch rate can be 27.7 um/hr (0.5 um etched in 65 sec.) such as if no diluent is used, or lower (e.g. 25 or 20 um/hr or less). For example, an etch rate of 7.2 um/hr (0.5 um etched in 250 sec.) can be achieved with a helium diluent. Even lower etch rates are achieved in an argon diluent or in a nitrogen diluent (0.5 um etched in 590 or 610 sec=3 um/hr). Other diluents and mixtures of diluents can be used, though it is preferred that the etch rate be 10 um/hr or less, 3 um/hr or less, or even 2 um/hr or 1 um/hr or less.

In the present invention, higher pressures (total pressures of all gas(es) used) in the etch chamber—particularly at the point of the material being etched, are desired—e.g. total pressures greater than 10 Torr, preferably greater than 20 Torr, and more preferably greater than 50 Torr. Total pressure ranges for the gas(es) in the etch chamber can be from 100 to 760 Torr (or 100 to 500 Torr), or more particularly within a range of 200 to 600 Torr (or 50 to 600 Torr). The total pressure and partial pressure to be used, depend in part upon whether a diluent is used, what type of diluent, and which vapor phase (non-plasma) etchant is used. If an interhalogen or noble gas fluoride (e.g. xenon difluoride) is the etchant used, the total pressure in the etch chamber can be 75 Torr or more, or even 200 Torr or more (e.g. from 200 Torr to 2 atm, 200 Torr to 1 atm, or within a narrower range of from 300 to 500 Torr. The total gas pressure is the pressure in the etch chamber preferably proximate to the material being etched, and is a combined pressure of all gas(es) provided to the etch chamber. The partial pressure of the vapor phase etchant itself is equal to or less than the total gas pressure—depending upon whether diluents are used or not. For example, in the present invention, if the total gas pressure is 10 Torr, then the partial pressure of the vapor phase etchant is 10 Torr or less (preferably 5 Torr or less, or 1 Torr or less). Likewise, if the total gas pressure is 50 Torr, then the partial pressure of the vapor phase etchant is 50 Torr or less (preferably 25 Torr or less, or 5 Torr or less). When operating at higher pressures, such as 200 Torr (or more), the partial pressure of the vapor phase etchant is 200 Torr or less (or 100 Torr or less), though preferably much lower than the total pressure (e.g. 50 or 25 Torr or less, or even 1 Torr or less).

In a further embodiment of the invention, a MEMS device is formed where a sacrificial layer (or layers) is deposited on a substrate. During or after deposition the sacrificial layer, the sacrificial material is doped with a dopant. The doping can occur during deposition of the sacrificial material, such as feeding a dopant into the process gas during a chemical vapor deposition of the sacrificial material. Or, the sacrificial material can first be deposited, followed by implanting the sacrificial layer with the dopant (e.g. phosphorous, arsenic, boron or other semiconductor dopant). In a preferred embodiment of the invention, the sacrificial layer is silicon (e.g. amorphous silicon, polycrystalline silicon), the material that is not to be etched is a non-silicon material, such as a metal (Al, Ti, Au, etc.) or metal compound (e.g. a nitride of titanium, aluminum tantalum-silicon, tungsten or an oxide of aluminum, silicon, tantalum, titanium, etc. or a metal carbide), where the silicon sacrificial is doped with the dopant. The dopant can be any dopant (e.g. borane, arsine or phosphine), though preferably one that improves the selectivity of the etch. Possible dopants if the sacrificial material is silicon, include PH3, P2H5, B2H5, BCl3, etc. The dopant can be implanted in accordance with standard semiconductor manufacturing implanting methods, or mixed into the process gas while depositing the sacrificial material, e.g. in accordance with such doping methods used in making solar cells. Other doping methods (diffusion, etc.) could also be used. The dopant can be used to dope only a top portion of the sacrificial layer, or the dopant can be made to be present throughout the sacrificial material. Doping can be at $10^{10}$ to $10^{18}$ ions/$cm^3$, such as around $10^{14}$ ions/$cm^3$. Implantation can be performed at an energy of 10 to 70 keV, preferably from 20 to 40 keV. Other implantation densities and energies could also be used.

In the present invention, the silicon can be polysilicon as set forth above, or amorphous silicon deposited by LPCVD or PECVD, or sputtering, or other materials and techniques as set forth in U.S. patent application Ser. No. 09/617,149 to Huibers et al. filed Jul. 17, 2000, U.S. patent application Ser. No. 09/631,536 to Huibers et al. filed Aug. 3, 2000, and Ser. No. 09/637,479 to Huibers filed Aug. 11, 2000, each incorporated herein by reference. Other micromechanical structural materials and methods can be used other than those set forth above, such as those materials set forth in U.S. application 60/293,092 to Patel et al. filed May 22, 2001, U.S. application 60/254,043 to Patel et al. filed Dec. 7, 2000, U.S. application Ser. No. 09/910,537 to Reid filed Jul. 20, 2001, and U.S. application 60/300,533 to Reid filed Jun. 22, 2001, each incorporated herein by reference.

The foregoing description and examples are offered primarily for purposes of illustration. It will be readily apparent to those skilled in the art that numerous modifications and variations beyond those described herein can be made while still falling within the spirit and scope of the invention.

What is claimed is:

1. A method for making a micromechanical device, comprising:
    depositing a silicon material and one or more functional layers on a substrate;
        removing the silicon material by providing a vapor phase etchant to the silicon material and removing the silicon material that is intervening between functional layers and/or between a functional layer and the substrate where a total gas pressure proximate to the silicon material is greater than 10 Torr, and wherein the vapor phase etchant is a non-plasma etchant and comprises a noble gas halide; and wherein a micromechanical device is formed after removing the silicon material.

2. The method of claim 1, wherein the silicon is PECVD amorphous silicon deposited in a glow discharge.

3. The method of claim 1, wherein the selectivity toward a material other than silicon is 2000:1 or more.

4. The method of claim 1, wherein the silicon has a long range order of 100 nm or less.

5. The method of claim 1, wherein a micromirror array is formed.

6. The method of claim 1, wherein the silicon is polysilicon.

7. The method of claim 1, wherein the silicon is doped during or after deposition.

8. The method of claim 1, wherein the silicon is etched at a pressure greater than 20 Torr.

9. The method of claim 8, wherein the selectivity toward a material other than silicon is 10000:1 or more.

10. The method of claim 8, wherein the silicon is etched at a pressure greater than 50 Torr.

11. The method of claim 1, wherein the silicon is amorphous silicon having a hydrogen concentration of 25 at % or less.

12. The method of claim 11, wherein the silicon is PECVD, LPCVD or sputtered silicon.

13. The method of claim 1, wherein prior to etching the silicon material:
    depositing the silicon material on a substrate; and
    depositing a layer other than silicon on the silicon material.

14. The method of claim 13, wherein the layer other than silicon is a silicon compound.

15. The method of claim 13, wherein the layer other than silicon is a metal or metal alloy.

16. The method of claim 13, wherein a plurality of layers other than silicon are deposited on the silicon material.

17. The method of claim 1, wherein the etching of the silicon material is at a pressure of from 100 to 760 Torr.

18. The method of claim 17, wherein the etching of the silicon material is at a pressure of from 200 to 600 Torr.

19. The method of claim 17, wherein the silicon comprises a dopant is selected from PH3, P2H5, B2H5 and BCl3.

20. The method of claim 17, wherein the silicon comprises a dopant is added during deposition of the silicon.

21. The method of claim 17, wherein the silicon comprises a dopant is added by ion implantation of the silicon.

22. The method of claim 21, wherein the ion implantation is performed at a 5 to 10 degree tilt angle of the substrate having the silicon thereon relative to the direction of the beams of ions.

23. The method of claim 1, wherein the silicon is preferentially etched relative to a material other than silicon.

24. The method of claim 23, wherein the material other than silicon is a silicon compound.

25. The method of claim 24, wherein the silicon compound is silicon nitride or silicon dioxide.

26. The method of claim 24, wherein the material other than silicon is a ceramic material.

27. The method of claim 26, wherein the ceramic material is a nitride or oxide of a transition metal.

28. The method of claim 1, wherein the vapor phase etchant is provided to a chamber in which the sample comprising silicon is disposed, and wherein the vapor phase etchant is capable of etching the sample in a non-energized state, and further comprising:
    monitoring the gas in or from the etching chamber; and
    determining the end point of the etch based on the monitoring of the gas from the etching chamber.

29. The method of claim 28, wherein an end point is determined based on a value of an etching product passing below a threshold.

30. The method of claim 28, wherein an end point is determined when a partial pressure of a gas component decreases for a predetermined period of time.

31. The method of claim 28, wherein curve smoothing is performed prior to determining an end point of the etch.

32. The method of claim 28, wherein a derivative is taken of partial pressure values of an etching product.

33. The method of claim 32, wherein an end point is determined when a derivative value is negative.

34. The method of claim 28, wherein the material is silicon and the etchant is a plurality of gas phase etchants.

35. The method of claim 34, wherein the etch product that is monitored is a silicon fluoride compound.

36. The method of claim 35, wherein the etch product that is monitored is SiF, SiF2, SiF3 and/or SiF4.

37. The method of claim 34, wherein the gas phase etchants are xenon difluoride and chlorine trifluoride.

38. The method of claim 37, wherein the doping is achieved by implantation at $10^{10}$ to $10^{14}$ ions/cm$^3$.

39. The method of claim 38, wherein the doping is performed at an energy of 10 to 70 keV.

40. A method for making a micromechanical device, comprising:
    depositing a silicon material on a substrate;
    depositing a layer other than silicon on the silicon material so as to form a sample to be etched;
    providing the sample to be etched to an etching chamber; providing a non-plasma vapor phase etchant to the silicon material in the etching chamber; and etching the silicon material from between the layer other than silicon and the substrate with an etchant comprising a noble gas halide, wherein the total gas pressure in the etching chamber proximate to the silicon material during the etch is 10 Torr or greater; and
    wherein a micromechanical device is feinted alter etching the silicon.

41. The method of claim 40, wherein the etching of the silicon material is at a pressure of from 50 to 600 Torr.

42. The method of claim 40, wherein the selectivity toward a material other than silicon is 2000:1 or more.

43. The method of claim 40, wherein the silicon has a long range order of 100 nm or less.

44. The method of claim 40, wherein a micromirror array is formed.

45. The method of claim 40, wherein the layer other than silicon is a silicon compound.

46. The method of claim 40, wherein the layer other than silicon is a metal or metal alloy.

47. The method of claim 40, wherein a plurality of layers other than silicon are deposited on the silicon material.

48. The method of claim 40, wherein the silicon is polysilicon.

49. The method of claim 40, wherein the silicon is etched at a rate of 15 um/hr or less.

50. The method of claim 40, wherein the providing of the vapor phase etchant to the silicon material is after a plasma etch of the silicon.

51. The method of claim 40, wherein the providing of the vapor phase etchant to the silicon material is after a wet chemical etch of the silicon.

52. The method of claim 40, wherein the silicon is a-Si.

53. The method of claim 52, wherein the silicon is PECVD a-Si.

54. The method of claim 52, wherein the silicon is PECVD, LPCVD or sputtered silicon.

55. The method of claim 40, wherein the vapor phase etchant is a noble gas fluoride or interhalogen.

56. The method of claim 55, wherein the vapor phase etchant is xenon difluoride.

57. The method of claim 40, wherein the silicon material is etched at a rate of 25 um/hr or less.

58. The method of claim 57, wherein the silicon material is etched at a rate of 20 um/hr or less.

59. The method of claim 57, wherein the silicon material is etched at a rate of 7.2 um/hr or less.

60. The method of claim 57, wherein the silicon material is etched at a rate of 3 um/hr or less.

61. The method of claim 40, wherein the etching of the silicon material is at a pressure of from 100 to 500 Torr.

62. The method of claim 61, wherein the silicon comprises a dopant is selected from PH3, P2H5, B2H5 and BCl3.

63. The method of claim 61, wherein the silicon comprises a dopant is added during deposition of the silicon.

64. The method of claim 61, wherein the silicon comprises a dopant is added by ion implantation of the silicon.

65. The method of claim 64, wherein the ion implantation is performed at a 5 to 10 degree tilt angle of the substrate having the silicon thereon relative to the direction of the beams of ions.

66. The method of claim 40, wherein a partial pressure of the vapor phase etchant is 10 Torr or below.

67. The method of claim 66, wherein a partial pressure of the vapor phase etchant is 5 Torr or below.

68. The method of claim 67, wherein a partial pressure of the vapor phase etchant is 1 Torr or below.

69. The method of claim 67, wherein a partial pressure of the vapor phase etchant is 5 Torr or below.

70. The method of claim 40, the silicon material is part of a silicon portion that is etched relative to a non-silicon portion of the sample, said non-silicon portion consisting of a member selected from the group consisting of a non-silicon metal, a compound of a non-silicon metal, and a silicon-containing compound in which silicon is bonded to a non-silicon element, by exposing both said silicon portion and said non-silicon portion to an etchant gas selected from the group consisting of noble gas fluorides and halogen fluorides, wherein said etchant gas is utilized in the form of a gas mixture in which said etchant gas is mixed with a non-etchant gaseous additive, the partial pressure of said etchant gas in said gas mixture being at least about 0.1 mbar, and the molar ratio of said non-etchant gaseous additive to said etchant gas being from about 1:1 to about 500:1, such that said gas mixture achieves substantially greater etching selectivity toward said silicon portion than would be achieved with said etchant gas alone.

71. The method in accordance with claim 70 in which said non-etchant gaseous additive has a molar-averaged formula weight of less than about 25.

72. A method in accordance with claim 70 in which said non-etchant gaseous additive has a molar-averaged formula weight of from about 4 to about 25.

73. A method in accordance with claim 70 in which said non-etchant gaseous additive has a molar-averaged formula weight of from about 4 to about 20.

74. A method in accordance with claim 70 in which said non-etchant gaseous additive has a molar-averaged formula weight of from about 4 to about 10.

75. A method in accordance with claim 70 in which said non-etchant gaseous additive has a molar-averaged thermal conductivity at 300 K and atmospheric pressure of from about 10 mW/(m K) to about 200 mW/(m K).

76. A method in accordance with claim 70 in which said non-etchant gaseous additive has a molar-averaged thermal conductivity at 300 K and atmospheric pressure of from about 140 mW/(m K) to about 190 mW/(m K).

77. A method in accordance with claim 70 in which said molar ratio is from about 10:1 to about 200:1.

78. A method in accordance with claim 70 in which said molar ratio is from about 20:1 to about 150:1.

79. A method in accordance with claim 70 in which said non-etchant gaseous additive is a member selected from the group consisting of nitrogen, argon, helium, neon, and mixtures thereof.

80. A method in accordance with claim 70 in which said non-etchant gaseous additive is a member selected from the group consisting of helium, neon, mixtures of helium and neon, and mixtures of one or both of helium and neon with one or both of nitrogen and argon.

81. A method in accordance with claim 70 in which said non-etchant gaseous additive is a member selected from the group consisting of helium, a mixture of helium and nitrogen, and a mixture of helium and argon.

82. A method in accordance with claim 70 in which said non-etchant gaseous additive is a member selected from the group consisting of helium and a mixture of helium and nitrogen.

83. A method in accordance with claim 70 in which said non-etchant gaseous additive is helium.

84. A method in accordance with claim 70 in which the partial pressure of said etchant gas is from about 0.3 mbar to about 30 mbar.

85. A method in accordance with claim 70 in which the partial pressure of said etchant gas is from about 1 mbar to about 15 mbar.

86. A method in accordance with claim 70 in which said silicon portion is a silicon layer deposited over a substrate and said non-silicon portion is a layer of a member selected from the group consisting of silicon nitride, silicon carbide, and silicon oxide deposited over said silicon layer, said non-silicon layer being patterned to leave vias therein for access of said gas mixture to said silicon layer, the exposure to said gas mixture being of sufficient duration to laterally etch away substantially all of said silicon layer by access through said vias.

87. A method in accordance with claim 70 in which said etchant gas is a noble gas fluoride.

88. A method in accordance with claim 87 in which said noble gas fluoride is a member selected from the group consisting of krypton difluoride and the xenon fluorides.

89. A method in accordance with claim 87 in which said noble gas fluoride is a member selected from the group consisting of xenon difluoride, xenon tetrafluoride, and xenon hexafluoride.

90. A method in accordance with claim 87 in which said noble gas fluoride is xenon difluoride.

91. A method in accordance with claim 87 in which said noble gas fluoride is xenon difluoride and said non-etchant gaseous additive is a member selected from the group consisting of helium, neon, and mixtures one or more or helium and neon with one or more of nitrogen and argon.

92. A method in accordance with claim 87 in which said noble gas fluoride is xenon difluoride and said non-etchant gaseous additive is a member selected from the group consisting of helium and a mixture of nitrogen and helium.

93. A method in accordance with claim 70 in which said etchant gas is a halogen fluoride.

94. A method in accordance with claim 93 in which said halogen fluoride is a member selected from the group consisting of chlorine trifluoride, bromine trifluoride, and iodine pentafluoride.

95. A method in accordance with claim 93 in which said halogen fluoride is a member selected from the group consisting of chlorine trifluoride and bromine trifluoride.

96. A method in accordance with claim 93 in which said halogen fluoride is bromine trifluoride.

97. A method in accordance with claim 70 in which the partial pressure of said etchant gas is from about 1 mbar to about 15 mbar, and the mole ratio of said non-etchant gaseous additive to said etchant gas is from about 10:1 to about 200:1.

98. A method in accordance with claim 97 in which the partial pressure of said etchant gas is from about 1 mbar to about 15 mbar, and the mole ratio of said non-etchant gaseous additive to said etchant gas is from about 20:1 to about 150:1.

99. A method in accordance with claim 70, in which said non-silicon portion is a member selected form the group consisting of non-silicon metals and metal compounds.

100. A method in accordance with claim 99 in which said non-silicon portion is a member selected from the group consisting of titanium, gold, tungsten, and compounds thereof.

101. A method in accordance with claim 99 in which said non-silicon portion is gold.

102. A method in accordance with claim 70 in which said silicon layer is a polysilicon layer deposited over a substrate and said non-silicon portion is a layer of silicon nitride, said silicon nitride layer being patterned to leave vias therein for access of said gas mixture to said polysilicon layer, said exposure to said gas mixture being of sufficient duration to laterally etch away substantially all of said polysilicon layer by access through said vias.

103. A method in accordance with claim 102 in which said polysilicon layer is from about 200 nm to about 5000 nm in thickness.

104. A method in accordance with claim 102 in which said polysilicon layer is from about 250 nm to about 3000 nm in thickness.

105. A method in accordance with claim 102 in which said polysilicon layer is from about 300 nm to about 1000 nm in thickness.

106. A method in accordance with claim 102 in which said silicon nitride layer is from about 10 nm to about 500 nm in thickness.

107. A method in accordance with claim 102 in which said silicon nitride layer is from about 20 nm to about 200 nm in thickness.

108. The method of claim 40, wherein the silicon is etched at a pressure greater than 20 Torr.

109. The method of claim 108, wherein the selectivity toward a material other than silicon is 10000:1 or more.

110. The method of claim 108, wherein the silicon is etched at a pressure greater than 50 Torr.

111. The method of claim 110, wherein a partial pressure of the vapor phase etchant is 50 Torr or below.

112. The method of claim 111, wherein a partial pressure of the vapor phase etchant is 25 Torr or below.

113. The method of claim 40, wherein the silicon is preferentially etched relative to a material other than silicon.

114. The method of claim 113, wherein the material other than silicon is a silicon compound.

115. The method of claim 114, wherein the silicon compound is silicon nitride or silicon dioxide.

116. The method of claim 114, wherein the material other than silicon is a ceramic material.

117. The method of claim 116, wherein the ceramic material is a nitride or oxide of a transition metal.

118. The method of claim 40, wherein the vapor phase etchant is provided to a chamber in which the sample comprising silicon is disposed, and wherein the vapor phase etchant is capable of etching the sample in a non-energized state, and further comprising:
monitoring the gas in or from the etching chamber; and
determining the end point of the etch based on the monitoring of the gas from the etching chamber.

119. The method of claim 118, wherein an end point is determined based on a value of an etching product passing below a threshold or a value of an etchant passing above a threshold.

120. The method of claim 118, wherein an end point is determined when a partial pressure of a gas component decreases for a predetermined period of time.

121. The method of claim 118, wherein curve smoothing is performed prior to determining an end point of the etch.

122. The method of claim 118, wherein the end point detection is an infrared analyzer.

123. The method of claim 118, wherein a derivative is taken of partial pressure values of an etching product.

124. The method of claim 123, wherein an end point is determined when a derivative value is negative.

125. The method of claim 118, wherein the material is silicon and the etchant is a gas fluoride etchant.

126. The method of claim 125, wherein the etch product that is monitored is a silicon fluoride compound.

127. The method of claim 126, wherein the etch product that is monitored is SiF, SiF2, SiF3 and/or SiF4.

128. The method of claim 40, wherein the etch rate of the silicon material is 25 um/hr or less.

129. The method of claim 128, wherein the etch rate of silicon material is 20 um/hr or less.

130. The method of claim 129, wherein the etch rate of the silicon material is 7.2 um/hr or less.

131. The method of claim 130, wherein the etch rate of the silicon material is 3 um/hr or less.

132. The method of claim 40, wherein a diluent is provided with the vapor phase etchant.

133. The method of claim 132, wherein the diluent comprises one or both of a diatom and a noble gas.

134. The method of claim 132, wherein the diluent is an inert gas.

135. The method of claim 134, wherein the diluent comprises helium, neon, argon and/or xenon.

136. The method of claim 132, wherein the diluent is a diatom.

137. The method of claim 136, wherein the diatom is H2, N2 and/or O2.

138. The method of claim 136, wherein the diatom is a halogen diatom.

139. The method of claim 138, wherein the halogen diatom is Cl2, F2, Br2 and/or I2.

140. The method of claim 40, wherein the silicon is doped during or after deposition.

141. The method of claim 140, wherein the silicon is doped with boron, phosphorous or arsenic.

142. The method of claim 141, wherein the doping is achieved by implantation at $10^{10}$ to $10^{18}$ ions/cm$^3$.

143. The method of claim 142, wherein the implantation is at $10^{14}$.

144. The method of claim 142, wherein the doping is performed at an energy of 10 to 70 keV.

145. The method of claim 144, wherein the doping is performed at an energy of 20 to 40 keV.

146. A method in accordance with claim 40, wherein the silicon material is etched at a pressure greater than 75 Torr.

147. A method in accordance with claim 146, wherein the silicon material is etched at a pressure greater than 200 Torr.

148. A method in accordance with claim 147, wherein the silicon material is etched at a pressure of 200 Torr to 2 atm.

149. A method in accordance with claim 148, wherein the silicon material is etched at a pressure of 200 Torr to 1 atm.

150. A method in accordance with claim 149, wherein the silicon material is etched at a pressure of 300 to 500 Torr.

151. The method of claim 147, wherein a partial pressure of the vapor phase etchant is 200 Torr or below.

152. The method of claim 151, wherein a partial pressure of the vapor phase etchant is 100 Torr or below.

153. The method of claim 152, wherein a partial pressure of the vapor phase etchant is 50 Torr or below.

154. The method of claim 40, wherein the vapor phase etchant is more than one vapor phase etchants.

155. The method of claim 154, wherein the vapor phase etchants are xenon difluoride and chlorine trifluoride.

156. The method of claim 154, wherein a diluent is provided with the vapor phase etchants.

157. The method of claim 156, wherein the diluent is a diatom.

158. The method of claim 157, wherein the diatom is H2, N2 and/or O2.

159. The method of claim 157, wherein the diatom is a halogen diatom.

160. The method of claim 159, wherein the halogen diatom is Cl2, F2, Br2 and/or I2.

* * * * *

UNITED STATES PATENT AND TRADEMARK OFFICE
CERTIFICATE OF CORRECTION

PATENT NO.        : 7,041,224 B2
APPLICATION NO. : 10/104109
DATED             : May 9, 2006
INVENTOR(S)       : Satyadev R. Patel It is certified that error appears in the above-identified patent and that said Letters Patent is hereby corrected as shown below:

Column 24, claim 40, line 14, "feinted alter" should read -- formed after --.

Signed and Sealed this

Fifth Day of September, 2006

JON W. DUDAS
*Director of the United States Patent and Trademark Office*